(12) United States Patent
Suzuki et al.

(10) Patent No.: US 6,547,953 B2
(45) Date of Patent: Apr. 15, 2003

(54) SUBSTRATE CONTAINER AND METHOD OF DEHUMIDIFYING SUBSTRATE CONTAINER

(75) Inventors: Yoko Suzuki, Yokohama (JP); Akira Tanaka, Yamato (JP); Kazuo Okubo, Yokohama (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/769,308

(22) Filed: Jan. 26, 2001

(65) Prior Publication Data

US 2001/0011640 A1 Aug. 9, 2001

(30) Foreign Application Priority Data

Jan. 28, 2000 (JP) ........................................ 2000-019734
Aug. 11, 2000 (JP) ........................................ 2000-245060

(51) Int. Cl.⁷ ............................................. B01D 53/26
(52) U.S. Cl. ..................... 205/765; 204/252; 204/264
(58) Field of Search ........................ 205/765; 204/252, 204/264

(56) References Cited

U.S. PATENT DOCUMENTS

| | | | |
|---|---|---|---|
| 4,528,078 A | | 7/1985 | Hirschfeld |
| 4,739,882 A | | 4/1988 | Parikh et al. |
| 4,967,295 A | * | 10/1990 | Yamauchi et al. ........ 360/97.02 |
| 5,059,291 A | | 10/1991 | Yamauchi et al. |
| 5,879,458 A | | 3/1999 | Roberson, Jr. et al. |

FOREIGN PATENT DOCUMENTS

| | | | |
|---|---|---|---|
| EP | 0 295 054 | | 12/1988 |
| JP | 36-114325 | * | 6/1985 ................ 205/765 |
| JP | 6-224288 | | 8/1994 |
| JP | 7-66273 | | 3/1995 |
| JP | 8-164319 | | 6/1996 |
| JP | 9-52018 | * | 2/1997 |
| JP | 9-155158 | | 6/1997 |
| JP | 10-71319 | | 3/1998 |
| JP | 11-137946 | | 5/1999 |

* cited by examiner

*Primary Examiner*—Arun S. Phasge
(74) *Attorney, Agent, or Firm*—Oblon, Spivak, McClelland, Maier & Neustadt, P.C.

(57) ABSTRACT

A substrate container includes a container housing having an opening for storing a substrate therethrough and a cover sealingly covering the opening, a fan motor mounted in the container housing for producing a circulating path of air in contact with the substrate in the container housing, and a particle removing filter and a gaseous impurity trapping filter which are disposed in the a portion of the circulating path which extends toward the substrate. A dehumidifying unit for dehumidifying a space in the container housing comprises a solid polymer electrolyte film disposed in the circulating path and voltage applying means for applying a voltage to the solid polymer electrolyte film to decompose water in air flowing in the circulating path thereby to dehumidify a space in the container housing.

14 Claims, 21 Drawing Sheets

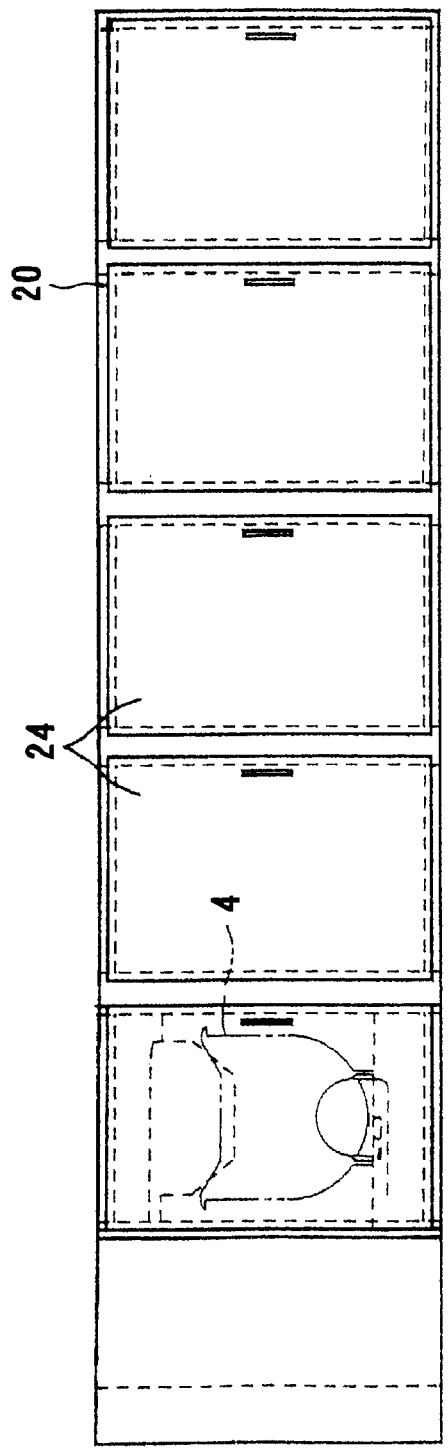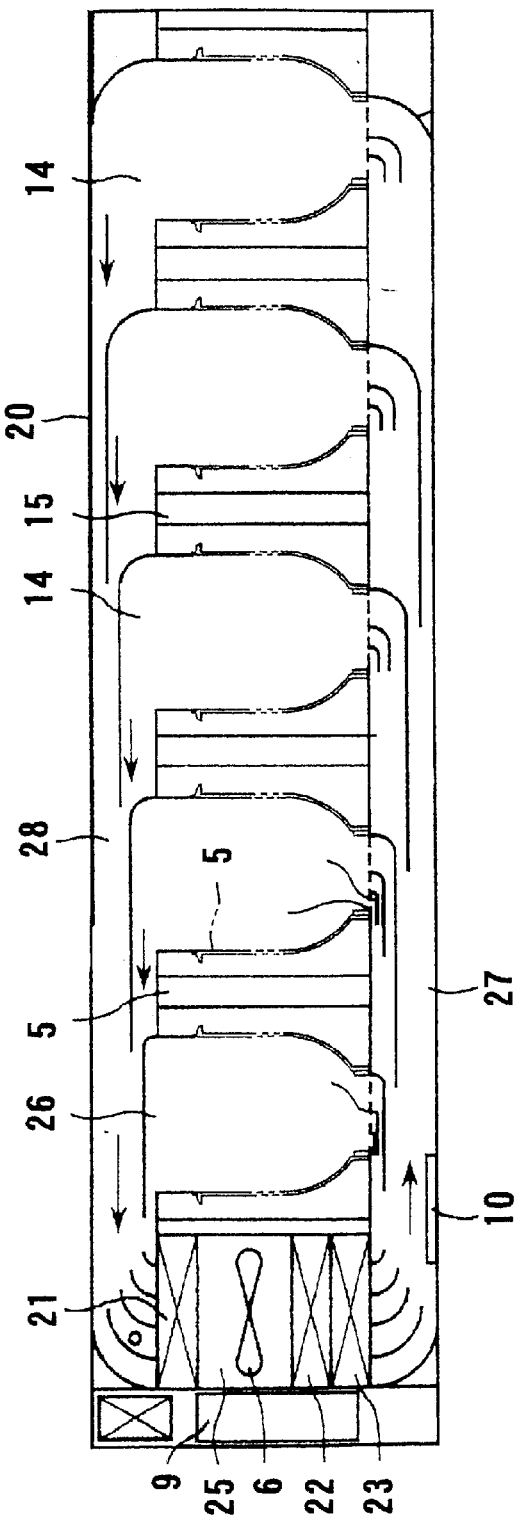

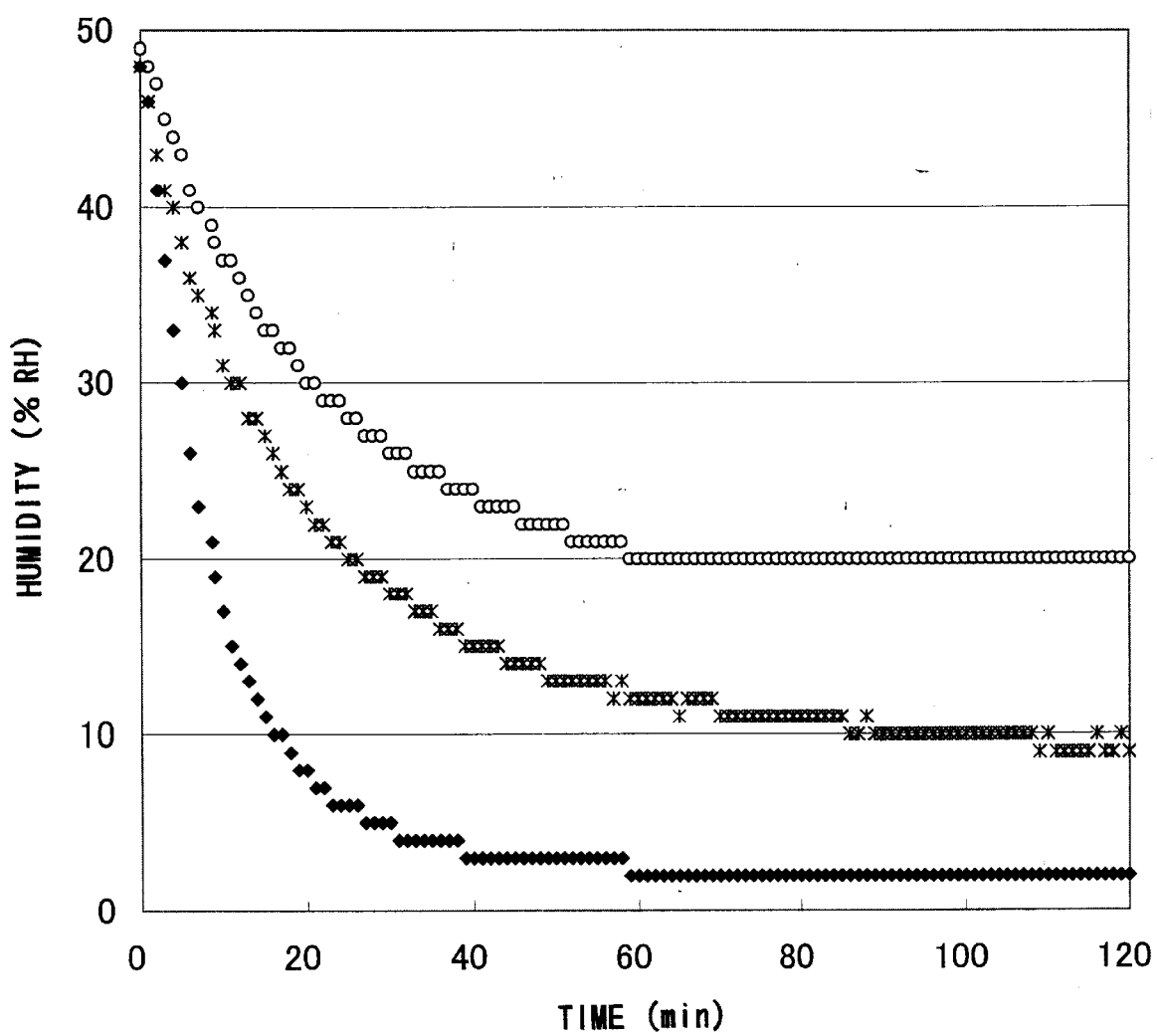

SUBSTRATE CONTAINER AND METHOD OF DEHUMIDIFYING SUBSTRATE CONTAINER

BACKGROUND OF THE INVENTION

1. Field of the Invention

The present invention relates to a substrate container (pod) with a humidity removing function such as a clean box, a substrate storage box, a substrate carrying container, a substrate holding rack, or the like for storing or transporting substrates such as semiconductor wafers, photo-masks, hard-disks, etc. in a highly clean atmosphere or a highly water-free atmosphere, and a method of dehumidifying such a substrate container.

2. Description of the Related Art

When substrates such as semiconductor wafers, photo-masks, etc. are delivered or stored in the fabrication process in semiconductor fabrication factories, the yield of products tend to decrease if a small amount of particulate contaminants or gaseous impurities present in the atmosphere is attached to those substrates. Such a tendency increases as the level of circuit integration grows. With the advent of magnetic reluctance heads, magnetic disks are required to record information at an increased density, and need to be highly clean against gaseous impurities as well as particulate contaminants. Furthermore, in view of reducing the corrosion of semiconductor substrates, there has been a demand for means for keeping at a low level the humidity of an atmosphere in which those semiconductor substrates are stored.

To create a clean space for accommodating substrates such as semiconductor wafers, magnetic disks, etc. when they are delivered or stored, there have been developed clean boxes equipped with a fan motor and a HEPA (High Efficiency Particle Air) filter or an ULPA (Ultra Low Penetration Air) filter. Such clean boxes also have a filter for removing gaseous impurities, such as a chemical filter, in order to avoid the adverse effect of such gaseous impurities, and also a dehumidifying means such as a desiccant for lowering the humidity.

There is known a compact and economical dehumidifying storage device, which comprises an electrochemical element in the form of a solid polymer electrolyte film that has an anode facing inwardly of a storage container and a cathode facing outwardly of the storage container.

The chemical filter and desiccant in the clean boxes have their service life depending on the gas concentration of the environment in which they are used and the level of contamination of the stored substrates. Generally, the service life of a filter for removing gaseous impurities is shorter than the service life of a particle removing filter. The gas concentration in the air which serves as the load on the filter for removing gaseous impurities ranges from several tens to several hundreds ng/g-air, whereas the water content in the air is 5 mg/g-air at the temperature of 20° C. It is apparent that the service life of the desiccant is shorter than the service life of the filter for removing gaseous impurities.

If there is used a dehumidifying unit capable of mechanically purging water from a circulating gas flow, rather than causing a desiccant to adsorb water in a circulating gas flow and replace the desiccant when its performance is lowered, then such a dehumidifying unit needs easy maintenance because it requires no parts replacement, and does not cause any contamination which would otherwise result from desiccant impurities.

It is known in the art that those chemical filters which adsorb gaseous impurities based on an ion exchange reaction have its impurity removing capability depending on the water content in the air, i.e., the humidity. It is necessary to keep the environment in the container or clean box at a minimum humidity level which makes it possible for the chemical filter to perform its function to remove gaseous impurities.

According to another process, the container or clean box is filled with a drying gas to achieve a low level of humidity therein. One problem with this process is that the humidity in the container rises unless the container is continuously supplied with the drying gas. The cause of the problem is that the container is made of a humidity-permeable synthetic resin and it is difficult to seal the container, which has an opening, against the molecular-level entry of material. In order to keep a low level of humidity therein in the container, therefore, it is necessary that the container be made of a humidity-impermeable material and the container have some means for removing water that tends to permeate or leak into the container.

SUMMARY OF THE INVENTION

It is therefore an object of the present invention to provide a substrate container for such as a clean box, a substrate feed container, a substrate holding rack, or the like for storing or transporting substrates, the substrate container having a dehumidifying unit which is maintenance-free and compact, is an energy saver, and is capable of controlling a level of humidity that can be achieved.

Another object of the present invention is to provide a method of dehumidifying a substrate container.

According to the present invention, there is provided a substrate container comprising a container housing having an opening for storing a substrate therethrough and a cover sealingly covering the opening, a fan motor mounted in the container housing for producing a circulating path of air in contact with the substrate in the container housing, a particle removing filter and a gaseous impurity trapping filter which are disposed in a portion of the circulating path which extends toward the substrate, and dehumidifying means for dehumidifying a space in the container housing, the dehumidifying means comprising a solid polymer electrolyte film disposed in the circulating path and voltage applying means for applying a voltage to the solid polymer electrolyte film to decompose water in air flowing in the circulating path thereby to dehumidify a space in the container housing.

The dehumidifying means further comprises an anode mounted on one surface of the solid polymer electrolyte film, and a cathode mounted on the other surface of the solid polymer electrolyte film, the voltage applying means comprising means for applying the voltage between the anode and the cathode across the solid polymer electrolyte film to control the humidity in the space in the container housing. One of the anode and cathode, or both of the anode and cathode may be provided with a catalyst attached thereto for promoting a dehumidifying action.

When a DC voltage is applied between the anode and the cathode, water in air flowing through the circulating path is decomposed to dehumidify the container housing. Specifically, when the dehumidifying means is energized, water adsorbed to the anode is decomposed into hydrogen ions and an oxygen gas by the anode catalyst. The hydrogen ions move through the solid polymer electrolyte film toward the cathode, are coupled to atmospheric oxygen on the side of the cathode, producing water, which is then discharged into the atmosphere outside of the cathode.

Since no water is accumulated in the solid polymer electrolyte film, the solid polymer electrolyte film can be used semi-permanently because its dehumidifying capability is not lowered after repeatedly used. The dehumidifying means is almost maintenance-free as the solid polymer electrolyte film does not need to be replaced. The solid polymer electrolyte film can safely be used in a highly clean environment as it does not produce contaminants. Though the solid polymer electrolyte film has a relatively small area, it has a large dehumidifying capability, and it is of a low-profile, compact structure that can easily be placed in the substrate container because it needs to be supplied with a DC electric energy that is required only to decompose the water.

It is known in the art that the ability of a filter, which operates based on an ion exchange reaction for its adsorption mechanism depends on water in air, i.e., humidity. It is necessary to keep a circulating air environment in the container housing at or higher than a minimum humidity level at which the ability of the filter can be maintained. Conventional desiccants are unable to set a desired humidity level to be reached to a desired value, and hence their ion removing capability tends to be lowered when it is combined with a dehumidifying function. The dehumidifying means according to the present invention is effective to solve the problems of the conventional desiccants. Specifically, when a certain voltage is applied across the solid polymer electrolyte film, the humidity in the container housing can be controlled at a desired level. Stated otherwise, the humidity of the air in the circulating path can be controlled depending on the voltage applied across the solid polymer electrolyte film. For example, the humidity of the air in the circulating path can be adjusted to a certain value, such as 10%, making it possible to generate an air flow with controlled humidity in the container housing. The voltage may be applied in such a pattern that when the humidity in the container housing is high immediately after the substrate container is opened, the container housing is quickly dehumidified, and then the humidity in the container housing is kept at a constant level.

Preferably, the substrate container further comprises a substrate holder for holding the substrate substantially parallel to the circulating path. The substrate thus held by the substrate holder can be supplied with clean air which has been dehumidified and from which particulate and gaseous contaminants have been removed.

Preferably, the substrate container further comprises a plurality of storage chambers for individually loading and unloading substrates or containers which hold substrates, the circulating path including air supply passage and an air discharge passage which are held in communication with the storage chambers, and common air circulating means for circulating clean air through the storage chambers through the air supply passage and the air discharge passage. The substrates in the storage chambers or the containers holding the substrates can be supplied with clean air which has been dehumidified and from which particulate and gaseous contaminants have been removed.

According to the present invention, there is also provided a method of dehumidifying a substrate container comprising the steps of producing a circulating air flow in a container housing which stores a substrate therein, and applying a voltage to a solid polymer electrolyte film placed in contact with the circulating air flow to decompose water in the circulating air flow thereby to dehumidify a space in the container housing. On a semiconductor wafer, for example, a naturally occurring oxide film grows due to water and oxygen contained in an environment in which the semiconductor wafer is stored. According to the present invention, after the semiconductor wafer is stored in a substrate transporting device, the substrate transporting device is filled with dry air to hold a water content in the substrate transporting device to a very low level for thereby suppressing the growth of the naturally occurring oxide film. At the same time, particulate contaminants and organic materials are effectively prevented from being adsorbed to the semiconductor wafer as the ability of the solid polymer electrolyte film is not lowered even when the low-humidity air is supplied.

Further, when dehumidifying the container atmosphere by utilizing the dehumidifier with its capability to full extent, the dehumidifying unit and a moisture absorbing material are both installed in the container, it is then possible to lower the humidity rapidly by operating a fan and other similar means to facilitate the container gases to contact the dehumidifying unit and the moisture absorber. Moisture absorbing material may include most preferably such materials as activated charcoal, activated carbon fiber, ion exchange resins, ion exchange non-woven cloths, fabrics or fibers, silica-gel and zeolite to adsorb gaseous impurities, and they should be dried prior to use so as to drive out moistures retained in the material. Of the ion exchange materials, those containing sulfonic acid are excellent moisture absorbers. By pre-treating to remove moisture beforehand, they can act as a superior desiccant. Also, if the ambient condition is about 15% RH, basic gases can also be absorbed effectively. In actual operation, it is most effective to maintain the moisture absorbing material in a dry condition in the dehumidifying unit constantly so as to preserve the initial state that exhibits the most moisture absorbing capacity.

If the container housing is filled with a drying gas when the solid polymer electrolyte film is used to dehumidify the container housing, then the dehumidifying rate can be increased, and the container housing can be maintained at a low level of humidity after the supply of the drying gas is stopped. An electric current consumed by the solid polymer electrolyte film is proportional to the humidity of the environment to be dehumidified. Consequently, as the humidity of the environment to be dehumidified is lower, the electric current consumed by the solid polymer electrolyte film is lower. Accordingly, supplying the drying gas when the solid polymer electrolyte film is used to dehumidify the container housing is effective to minimize the current consumption. This is particularly advantageous when a secondary battery with a limited battery capacity is used to energize the solid polymer electrolyte film.

The above and other objects, features, and advantages of the present invention will become apparent from the following description when taken in conjunction with the accompanying drawings, which illustrate preferred embodiments of the present invention by way of example.

BRIEF DESCRIPTION OF THE DRAWINGS

FIG. 25A is a front elevational view of a substrate storage device according to a second embodiment of the present invention; and FIG. 25B is a vertical cross-sectional view of the substrate storage device shown in FIG. 25A;

FIG. 26 is a diagram showing a dehumidifying capability according to operational condition of fan and dehumidifying unit.

DETAILED DESCRIPTION OF THE PREFERRED EMBODIMENTS

Figure 1:
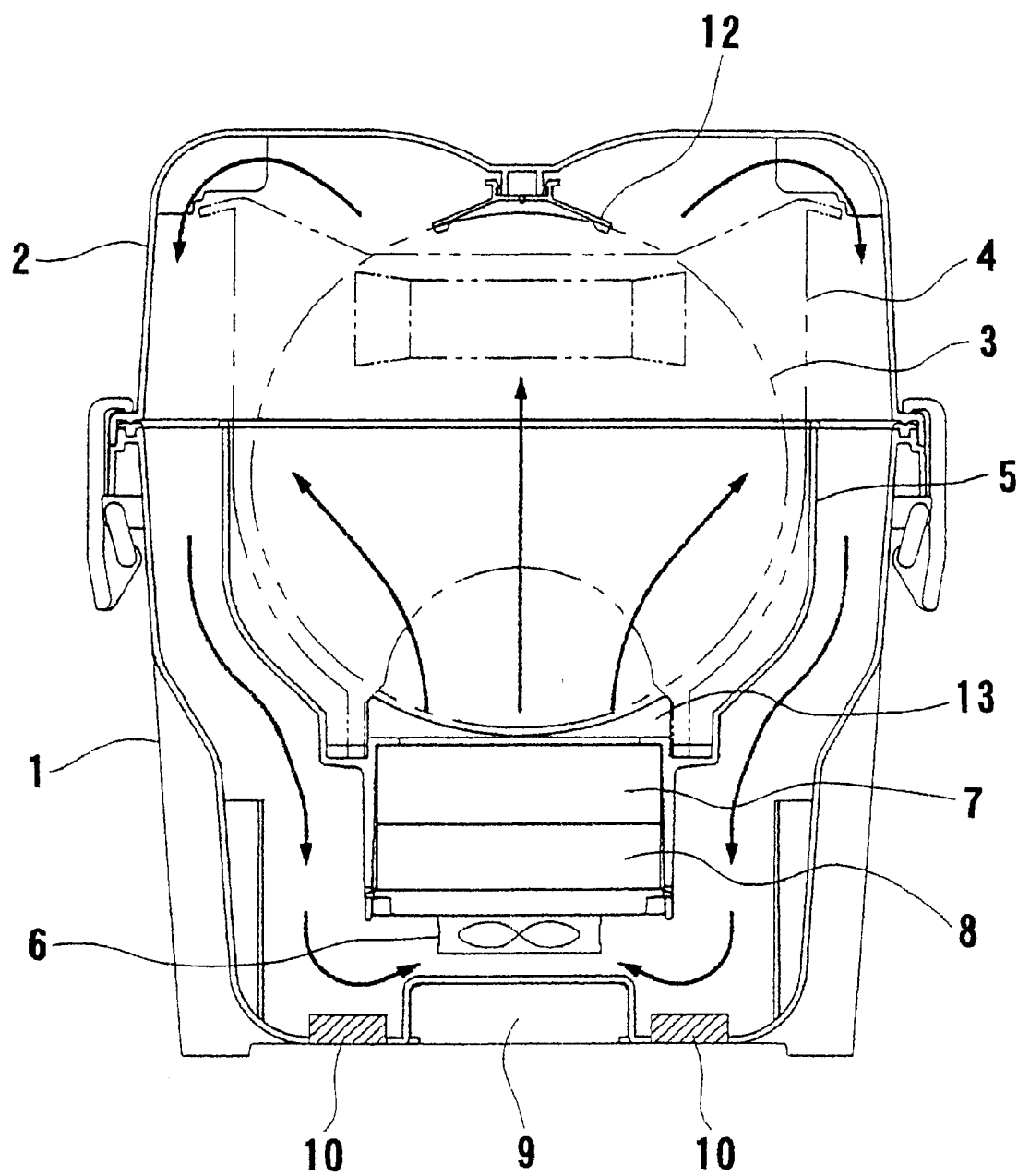
FIG. 1 is a vertical cross-sectional view of a substrate container according to a first embodiment of the present invention.

Like or corresponding parts are denoted by like or corresponding reference characters throughout views.

FIG. 1 shows in vertical cross section a substrate container according to a first embodiment of the present invention. As shown in FIG. 1, the substrate container (pod) comprises a box housing 1 and a box cover 2 which are coupled to each other to define hermetically sealed space for storing therein semiconductor wafers 3, for example, in a highly clean atmosphere. The semiconductor wafers 3 are held by a carrier or storage case 4 and a wafer holder 12, the carrier 4 being supported by a partition 5 disposed in the box housing 1. A flow-rectifying plate 13 is positioned underneath the partition 5 for preventing air from flowing excessively into gaps between the semiconductor wafers 3 and the carrier 4. A particle trapping filter 7 and a gaseous impurity trapping filter 8 positioned therebeneath are disposed below the carrier 4 and the flow-rectifying plate 13. A fan 6 is positioned below the gaseous impurity trapping filter 8 for directing air upwardly through the gaseous impurity trapping filter 8 and the particle trapping filter 7.

The particle trapping filter 7 comprises HEPA and ULPA filters for removing particulate contaminants to prevent the semiconductor wafers 3 from being contaminated by particles. The gaseous impurity trapping filter 8 comprises a chemical filter for removing chemical contaminants to prevent the semiconductor wafers 3 from being contaminated by molecules. A power supply unit 9 is mounted on a lower end of the box housing 1.

Immediately after completion of manufacture process, ion exchange nonwoven fabrics, activated carbon and the like used for removing chemical contaminants have water adsorbed thereon. Therefore, when the use of them in applications where the low-humidity environment in a short time is required, these materials are preferably dehydrated prior to use in such applications.

In operation, the fan motor 6 sends air upwardly through the filters 8, 7 and gaps between the semiconductor wafers 3 parallel thereto, and then downwardly around the partition 5 into a suction region of the fan motor 6, thereby making a circulating air flow in the substrate container as indicated by the arrows.

The substrate container serves as a container for storing and transporting one lot of 25 semiconductor wafers 3, for example, and has a relatively small volume of several tens liters. The substrate container has a dehumidifying unit 10 with a solid polymer electrolyte film, which is positioned in an outer air flow circulation path in the box housing 1 around the suction region of the fan motor 6. The position and size of the solid polymer electrolyte film may be changed depending on a desired level of humidity to be reached in the substrate container. The solid polymer electrolyte film is supplied with a DC voltage from the power supply unit 9.

For low-humidity retention purposes, the container is preferably formed of a material having low water absorption. The reason for this is as follows. In an environment under conventional setting conditions for clean rooms, that is, under conditions of 25° C. and 50% RH, when only the humidity within the substrate container is lowered, moisture is moved into a container having lower humidity for three causes: 1̂ water contained in a polymeric material constituting the container is moved toward lower humidity side due to humidity gradient; 2̂ water contained in air in an environment outside the container penetrates the container due to humidity gradient between the outside of the container and the inside of the container and thus is moved into the container; and 3̂ air in an environment outside the container is introduced from joints in the container into the container. In the case of highly hermetically sealed substrate containers, among these causes, the cause, which has the greatest influence on an increase in the humidity within the container, is 1̂, that is, the movement of water absorbed in a polymeric material toward lower humidity side.

The water absorption of polymeric materials is generally measured according to ASTM (American Society for Testing and Materials) D 570, and is described, for example, in literature or catalogues available from manufacturers of polymeric materials. Polycarbonate is extensively used as a polymeric material for the substrate container. Since the water absorption of polycarbonate is 0.2 to 0.3%, for example, the container body and the door (weight: 3 kg) contain 6 to 9 g of water. The amount of water brought into the container can be reduced by molding the container from a material having a water absorption of not more than 0.1%. This can also contribute to an improvement in performance of the dehumidifier. Polymeric materials having a water absorption of not more than 0.1% include polyethylene (<0.01% (water absorption; the same shall apply hereinafter)), polypropylene (0.03%), polybutylene terephthalate (0.06 to 0.08%), polyphenylene sulfide (0.02%), polytetrafluoroethylene (<0.01%), polycarbonate loaded with 20% carbon (0.1%), and polybutylene terephthalate loaded with 20% carbon (0.05%). Among them, polyphenylene sulfide and polybutylene terephthalate, which possess excellent chemical resistance and high-temperature properties and low molding shrinkage, and polyphenylene sulfide and polybutylene terephthalate each loaded with carbon are preferred for the substrate-container.

The material of the substrate container preferably has water absorption at least below 0.3%, Polymeric materials having a water absorption of not more than 0.1% include polyethylene <0.01%, polypropylene (0.03%), polybutylene terephthalate (0.06 to 0.08%), polyphenylene sulfide (0.02%), polytetrafluoroethylene (<0.01%), polycarbonate loaded with 20% carbon (0.1%), and polybutylene terephthalate loaded with 20% carbon (0.05%). Among them, especially preferable material of the container includes polyphenylene sulfide, polyphenylene sulfide loaded with carbon, polybutylene terephthalate loaded with carbon, and polycarbonate loaded with carbon. These material possess water absorption of less than 0.1%, excellent chemical resistance and high-temperature properties, and low molding shrinkage of less than 1% preferably less than 0.5%. These material may be alloy material formed by mixing different material, if the above mentioned functions are satisfied.

Bringing the humidity to a lower level is likely to cause the wafer to be electrified. Therefore, at least a wafer-supporting member, which comes into contact with the wafer, and a door, which extends from the wafer-supporting member to the lower part of the container, are particularly preferably formed of a conductive material loaded with carbon or other conductive material. Polymeric materials are generally classified according to the surface resistivity into static electricity-conductive materials having a surface resistivity of $1\times10^3$ to $1\times10^8$ $\Omega$, static electricity-diffusing materials having a surface resistivity of $1\times10^5$ to $1\times10^{12}$ $\Omega$, and insulating materials having a surface resistivity of not less than $1\times10^{12}$ $\Omega$. Further, polymeric materials are classified according to the volume resistivity into static electricity-conductive materials having a volume resistivity of $1\times10^2$ to $1\times10^5$ $\Omega\cdot cm$, static electricity-diffusing materials having a volume resistivity of $1\times10^4$ to $1\times10^{11}$ $\Omega\cdot cm$, and insulating materials having a volume resistivity of not less than $1\times10^{11}$ $\Omega\cdot cm$. According to the present invention, the polymeric material for the container is preferably such that the surface resistivity is not more than $1\times10^{10}$ $\Omega$ and the volume resistivity is not more than $1\times10^9$ $\Omega\cdot cm$, and is more preferably such that the surface resistivity is not more than $1\times10^8$ $\Omega$ and the volume resistivity is not more than $1\times10^7$ $\Omega\cdot cm$.

The solid polymer electrolyte film has an area of several cm×several cm, and a thickness of about several hundreds μm. The dehumidifying unit 10 has an anode mounted on one surface of the solid polymer electrolyte film and a cathode mounted on the other surface of the solid polymer electrolyte film. A catalyst for promoting a dehumidifying action is attached to the anode. When the DC voltage from the power supply unit is applied to the solid polymer electrolyte film through the anode and the cathode, the dehumidifying unit dehumidifies the space in the substrate container based on the principles of an electrolysis of water. However the catalyst may be attached to the cathode, or to both of the anode and the cathode. Specifically, when the dehumidifying unit is energized, water adsorbed to the anode is decomposed into hydrogen ions and an oxygen gas by the anode catalyst. The hydrogen ions move through the solid polymer electrolyte film toward the cathode, are coupled to atmospheric oxygen on the side of the cathode, producing water, which is then discharged into the atmosphere outside of the cathode. Therefore, the space in the substrate container is dehumidified according to a process completely different from the process of the conventional desiccant. Since no water is accumulated in the solid polymer electrolyte film, the solid polymer electrolyte film can be used semi-permanently. The dehumidifying unit 10 is almost maintenance-free as the solid polymer electrolyte film does not need to be replaced. Though the solid polymer electrolyte film has a relatively small area, it has a large dehumidifying capability, and it is of a low-profile, compact structure that can easily be placed in the substrate container. The dehumidifying capability of the dehumidifying unit 10 can be adjusted by controlling the DC voltage applied across the solid polymer electrolyte film for thereby controlling the desired level of humidity to be achieved in the substrate container. In addition, the dehumidifying unit 10 is an energy saver because it only consumes an amount of electric energy that is required to electrolyzing water.

Figure 2:
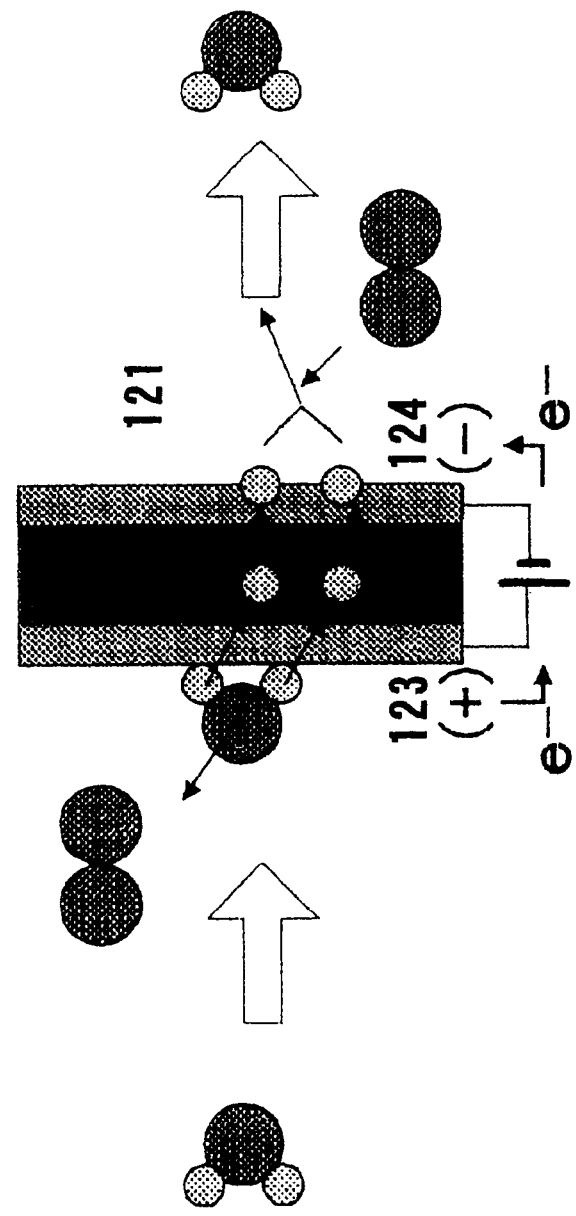
FIG. 2 is a schematic view showing mechanism of dehumidification by solid polymer electrolyte film.

The mechanism of dehumidification is shown in FIG. 2. According to this method, a water molecule in a space 120 on dehumidification side is catalytically decomposed into hydrogen and oxygen. The hydrogen is transferred through a solid polymer electrolyte film 121 with a predetermined voltage applied thereto, and released to the outside of a dehumidification space 120, that is, into a space 122 on moisture release side, to remove moisture.

Figure 3:
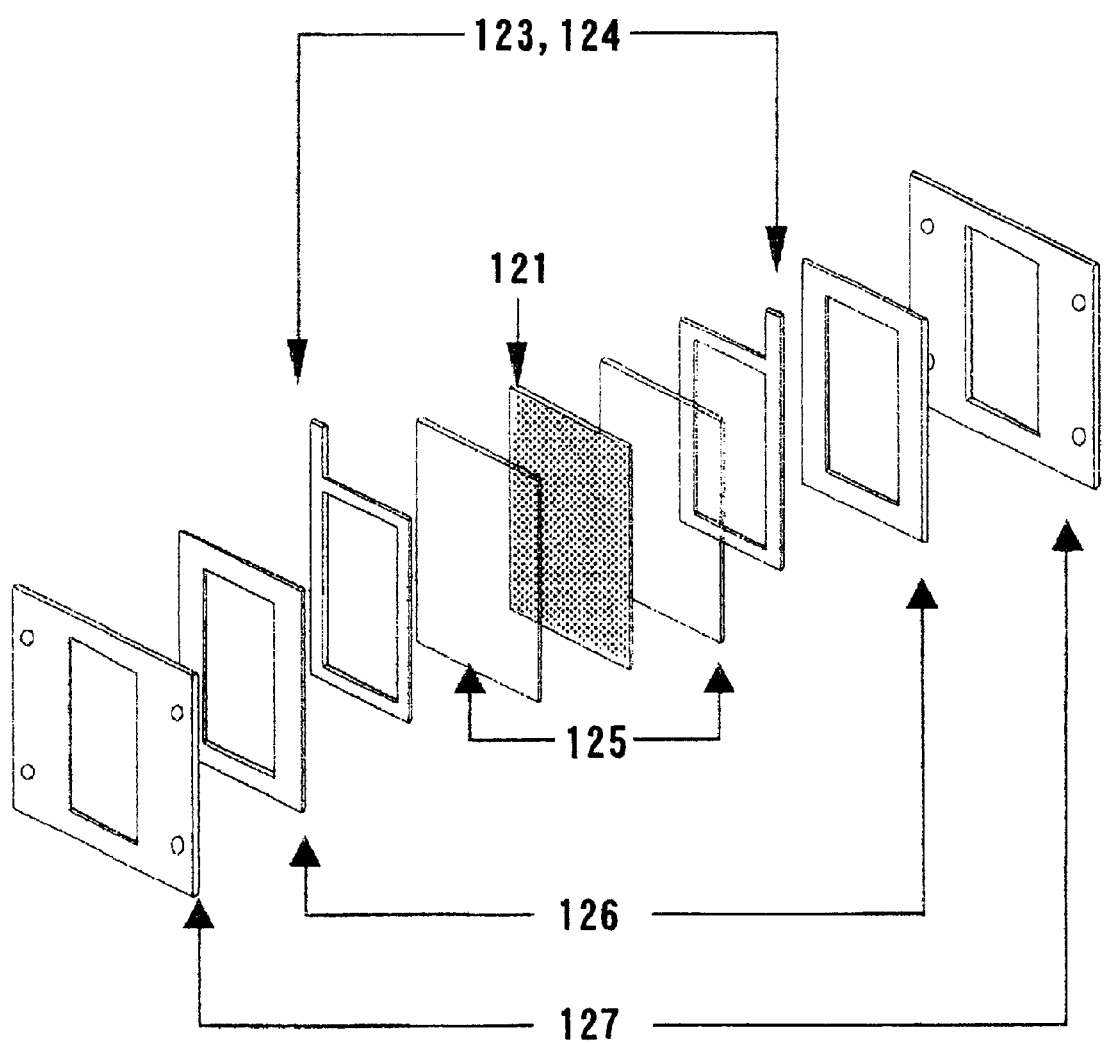
FIG. 3 is a decomposing view of a dehumidification unit using a solid polymer electrolyte film.
Figure 4:
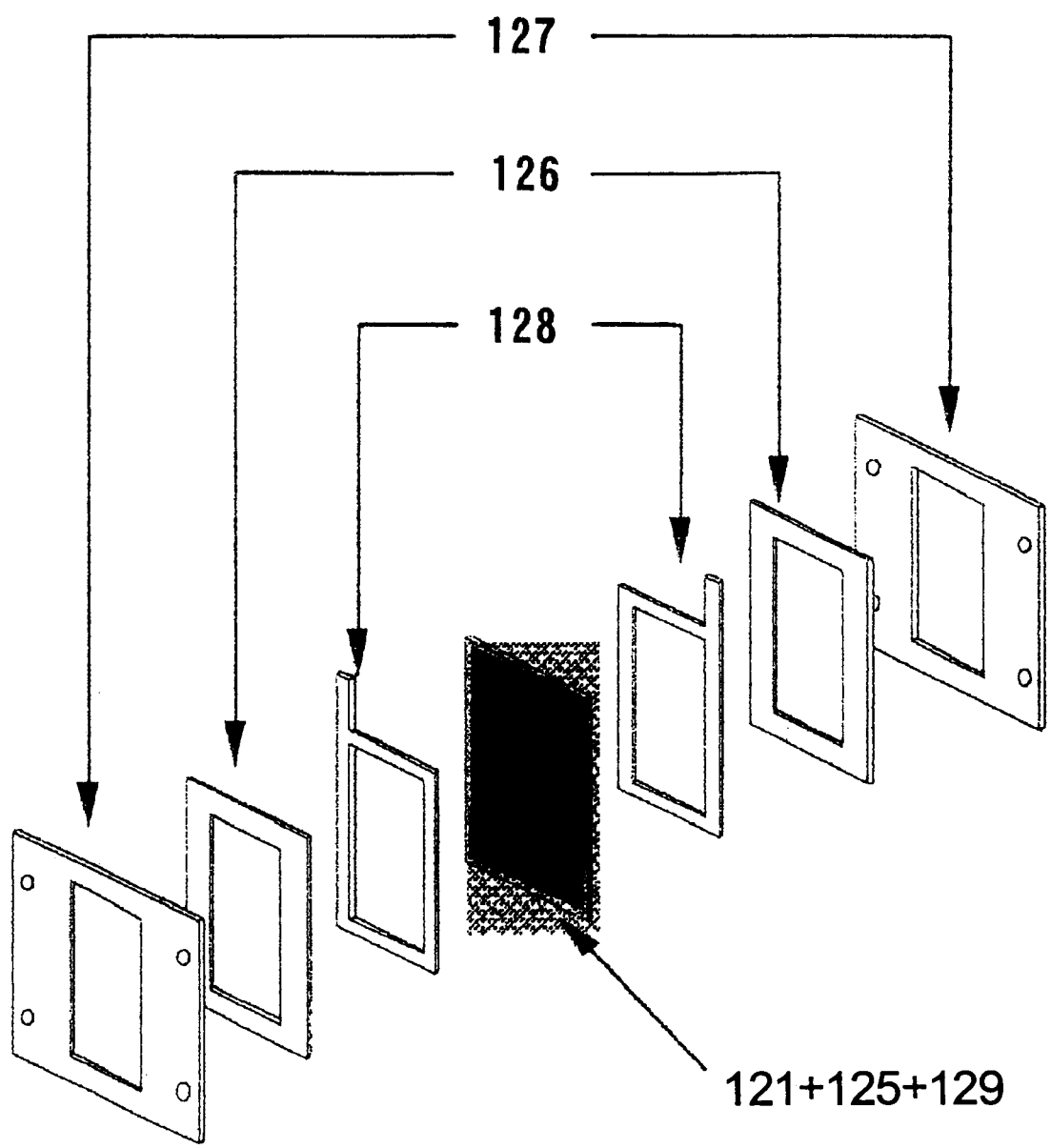
FIG. 4 is another decomposing view of a dehumidification unit using a solid polymer electrolyte film.

An example of the components of dehumidification unit using a solid polymer electrolyte film is shown in FIG. 3. An anode 123, a cathode 124, a solid polymer electrolyte film 121, and a catalyst layer 125 are indispensable components. Regarding the feature of the assembly of the components, the anode 123 and the cathode 124 each are provided with a catalyst layer 125 and a porous substrate. The substrate bites into the solid polyelectrolyte polymer electrolyte film 121, and the catalyst layer is formed in the bite portion. Therefore, the assembly is characterized in that the solid polymer electrolyte film 121, the porous electrode 129 (123, 124), and the catalyst 125 constitute an integral structure. For example, ROSAHL manufactured by RYOSAI TECHNICA may be used (see FIG. 4).

Figure 5:
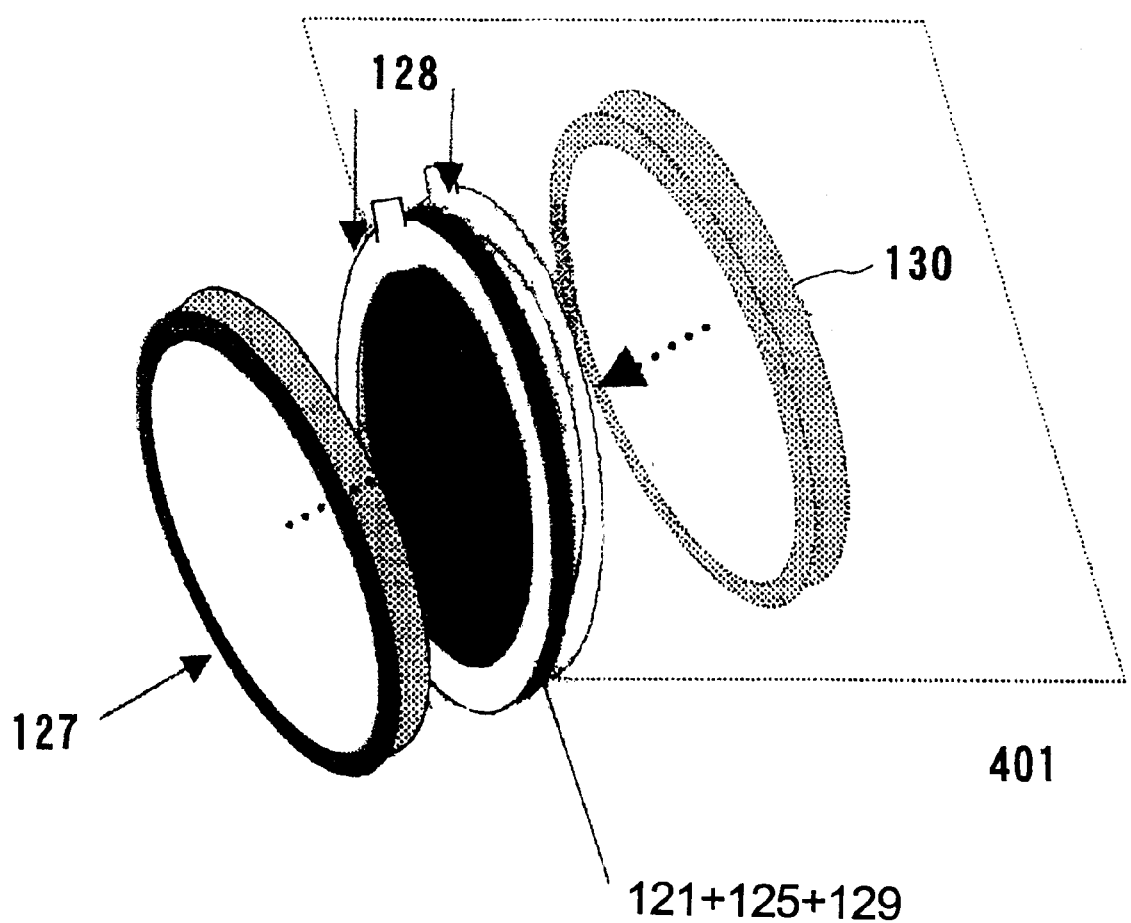
FIG. 5 is further another decomposing view of a dehumidification unit using a solid polymer electrolyte film.

Another example of the structure of dehumidifying unit based on solid polymer electrolyte film is shown in FIG. 5. This is an example in which the fixed flange section 127 is molded to the container main body 401. The effective area of the dehumidifying unit may be shaped as square, rectangle, circle, oval, polygonal and others. But it is preferable to design a shape so that the proportion of the effective area (opening area of contact with the gas to be processed) relative to the electrode area is high, so that the ratio of the opening area to the electrode area is preferably more than 50% but less than 99%, more preferably more than 60% and less than 90%. Also, if the ratio of the opening area in contact with the gas to be processed and the electrode area is the same, an oval shape is preferable to a circular shape, and a rectangle shape is preferable to a square shape. Specifically, it is preferable to design the electrolyte film so that the short axis or short perimeter is more than 10% and less than 99% in relation to corresponding long axis or long perimeter.

Any solid polymer electrolyte film may be used so far as the film can transfer proton. For example, a solid polymer electrolyte film having a nominal film thickness of about 170 $\mu$m, for example, Nafion-117 (registered trademark, manufactured by E. I. du Pont de Nemours & Co.), may be used. Further, for example, Nafion-115, XUS-13, 204, and 10 manufactured by Dow Chemical Company may also be used. The catalyst is preferably platinum black from the viewpoint of performance and durability. Alternatively, a platinum-on-carbon catalyst and other catalysts of metals belonging to the platinum group may be used. A current terminal 128 necessary for applying an even voltage to the porous electrode 129 is preferably formed of aluminum, stainless steel or the like. Further, the use of PTFE or the like, which causes no significant degassing of organic matter from the packing, is preferred. Since the fixed flange comes into direct contact with processing gas, the use of metals susceptible to attack by the process gas is preferably avoided. In this case, the use of a resin material, for example, polycarbonate, is preferred. When any corrosive gas is not used, stainless steel is also be used. Further, a guide is preferably provided on the fixed flange or the container body so as to avoid direct access to the electrode from the outside of the assembly.

Figure 6:
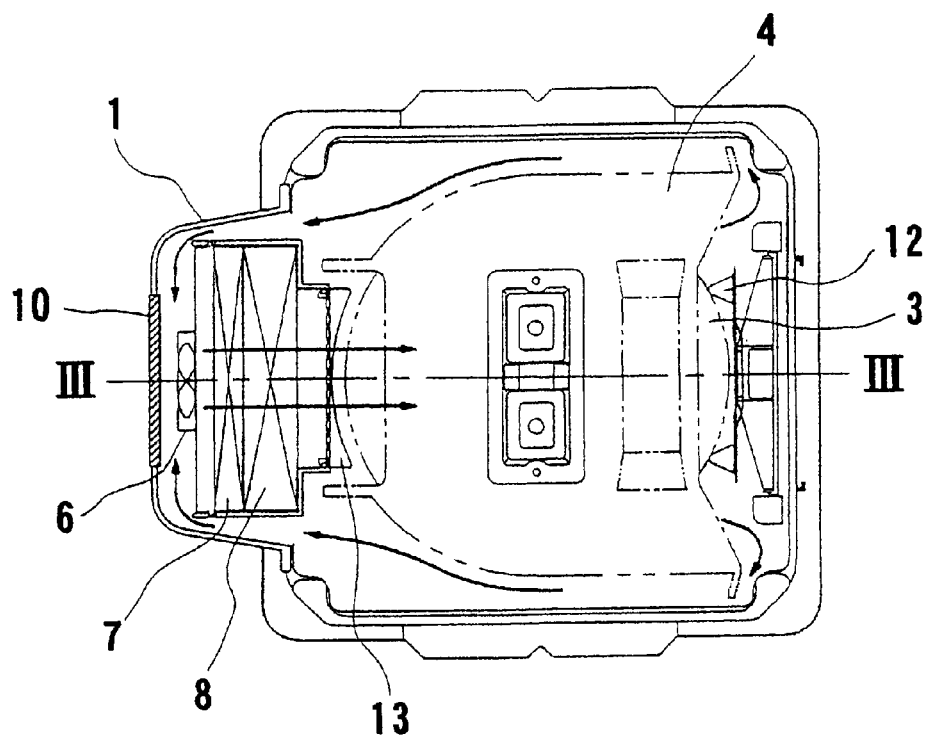
FIG. 6 is a vertical cross-sectional view of an automatized substrate container for storing wafers that are 200 mm diameter, according to a modification of the substrate container shown in FIG. 1.
Figure 7:
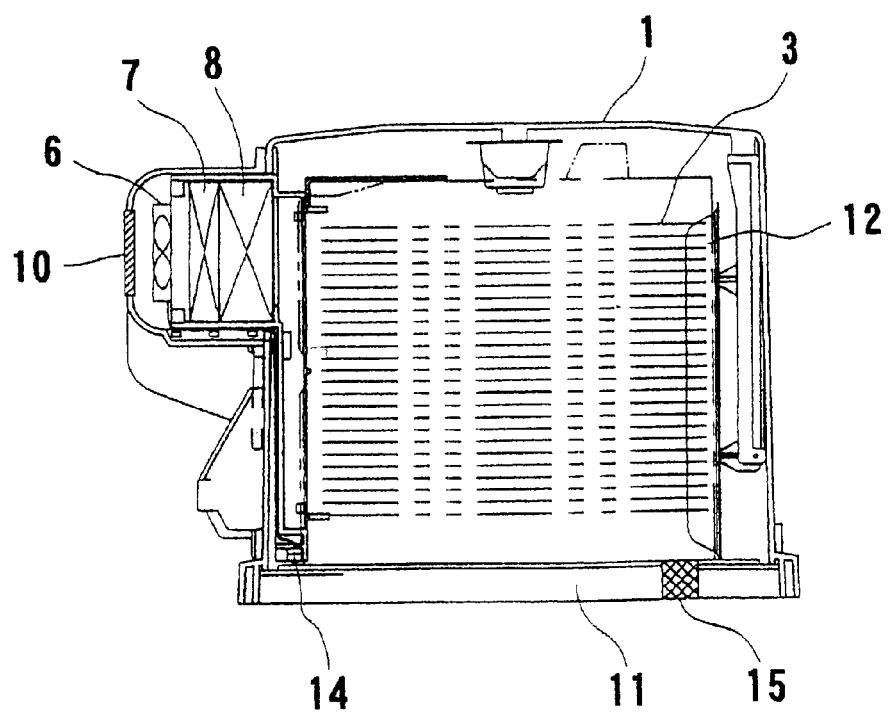
FIG. 7 is a cross-sectional view taken along line III—III of FIG. 6.

FIGS. 6 and 7 show an automatized substrate container for storing wafers that are 200 mm diameter, according to a modification of the substrate container shown in FIG. 1. The automatized substrate container comprises a box housing 1 and a bottom wafer loading/unloading door 11 which are coupled to each other to define hermetically sealed space for storing therein semiconductor wafers 3, for example, in a highly clean atmosphere. The semiconductor wafers 3 are held by the carrier 4 which is supported by a support disposed in the box housing 1.

Air delivered by the fan motor 6 flows upwardly through the filters 8, 7 and gaps between the semiconductor wafers 3 parallel thereto, and then downwardly into a suction region of the fan motor 6, thereby making a circulating air flow in the substrate container as indicated by the arrows.

A power supply unit with a secondary battery is mounted on the bottom wafer loading/unloading door 11, which has contacts connected to terminals 14 of the motor fan 6. The substrate container may be supplied with a drying gas to dry the space therein. In order to discharge the drying gas, the bottom wafer loading/unloading door 11 also has a drying gas purge port 15 defined therein.

The substrate container serves as a container for storing and transporting one lot of 25 semiconductor wafers 3, for example, and has a relatively small volume of several tens liters. The substrate container has a dehumidifying unit 10 with a solid polymer electrolyte film, which is positioned in an outer air flow circulation path in the box housing 1 at the suction region of the fan motor 6. The position, size, and number of the solid polymer electrolyte film, and the drying gas purge port 15 may be changed depending on a desired level of humidity to be reached in the substrate container and a desired dehumidifying rate. The solid polymer electrolyte film is supplied with a DC voltage from the power supply unit on the bottom wafer loading/unloading door 11 via the terminals 14.

Figure 21:
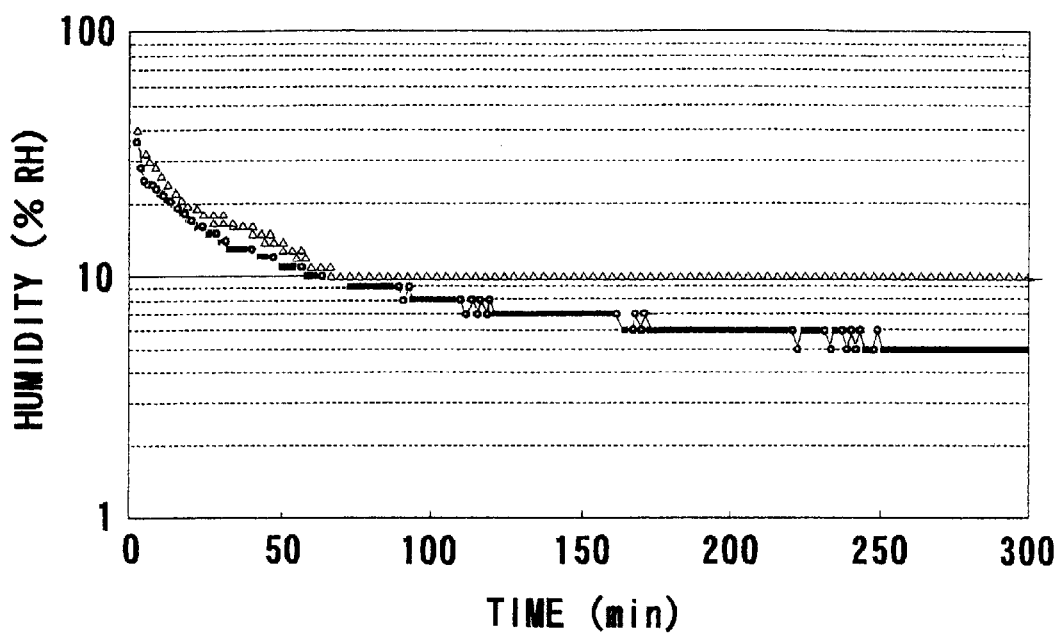
FIG. 21 is a diagram showing, for comparison, a dehumidifying capability of a dehumidifying unit with a solid polymer electrolyte film according to the present invention and a dehumidifying capability of a conventional desiccant.

FIG. 21 shows how the humidity in the substrate container is varied with time by the dehumidifying unit 10 with the solid polymer electrolyte film. The substrate container placed in a clean room at a temperature of 22° C. and a relative humidity of 40% was opened for 3 minutes. After the substrate container was closed, the humidity in the substrate container was measured. In the substrate container equipped with the chemical filter 8, it is necessary to set the humidity level to be reached to 10% for allowing the chemical filter 8 to keep its ability to remove gaseous contaminants. Therefore, the level of humidity to be achieved by the dehumidifying unit was set to a relatively humidity of 10%. Measured data from the substrate container with the dehumidifying unit 10 are indicated by Δ in FIG. 21. For comparison, a desiccant was placed in a substrate container, and the humidity in the substrate container was measured. Measured data from the substrate container with the desiccant are indicated by ○ in FIG. 21. The humidity in the substrate container with a brand-new desiccant dropped to 20% 15 minutes after the substrate container was closed, and to 10% one hour after the substrate container was closed. Thereafter, the humidity in the substrate container dropped until it reached about 5% when an equilibrium state was reached. The humidity in the substrate container with the dehumidifying unit 10 dropped to 20% 18 minutes after the substrate container was closed, and to 10% one hour after the substrate container was closed. Thereafter, the humidity in the substrate container was maintained at 10%. It can be understood from the data shown in FIG. 21 that the dehumidifying rates of the desiccant and the solid polymer electrolyte film are substantially the same as each other from the humidity level of 40% to the humidity level of 10%, and that the humidity level that can be achieved by the solid polymer electrolyte film can be set to a desired value above its dehumidifying capability level.

Figure 8:
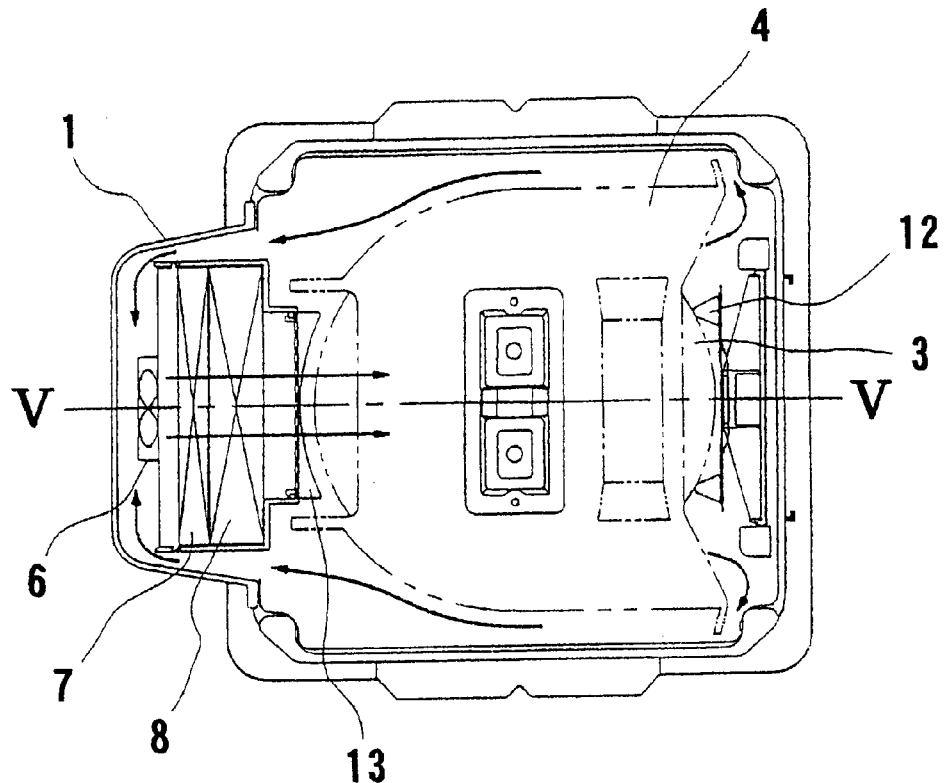
FIG. 8 is a vertical cross-sectional view of an automatized substrate container with a solid polymer electrolyte film disposed in a position different from the position of the solid polymer electrolyte film in the automatized substrate container shown in FIG. 6.
Figure 9:
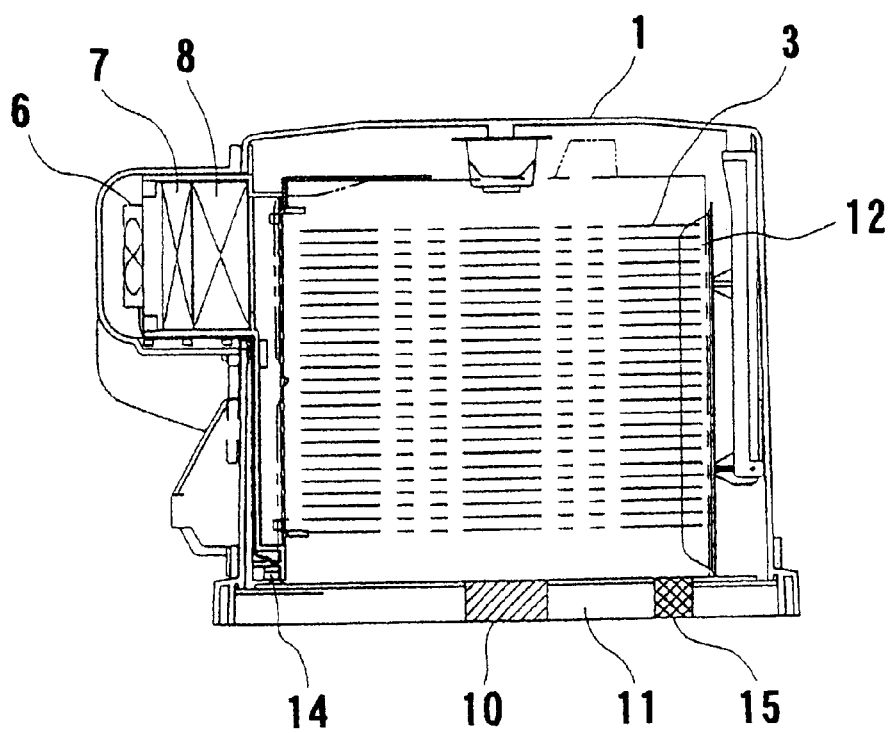
FIG. 9 is a cross-sectional view taken along line V—V of FIG. 8.

FIGS. 8 and 9 show an automatized substrate container with a solid polymer electrolyte film disposed in a position different from the position of the solid polymer electrolyte film in the automatized substrate container shown in FIGS. 6 and 7. In the automatized substrate container shown in FIGS. 8 and 9, the solid polymer electrolyte film mounted on the bottom wafer loading/unloading door 11. Therefore, the DC voltage from the power supply unit can directly be applied to the solid polymer electrolyte film without the terminals 14.

When the dehumidification unit according to the present invention is loaded on a substrate-receiving box which can cope with automation, the operation control of the fan and the dehumidification unit at the time of opening and closing of the door greatly affects the dehumidification performance. The reason for this is as follows. When the door is in a closed state, the humidity can be rapidly decreased to a low level by keeping a hygroscopic material, such as a chemical filter, in a dried state by means of the dehumidification unit. By contrast, when the fan is operated during opening of the door, high-humidity air in the clean room is forcibly fed into the hygroscopic material, leading to a problem that, when the door is closed again, the dehumidification performance is deteriorated.

Figure 27:
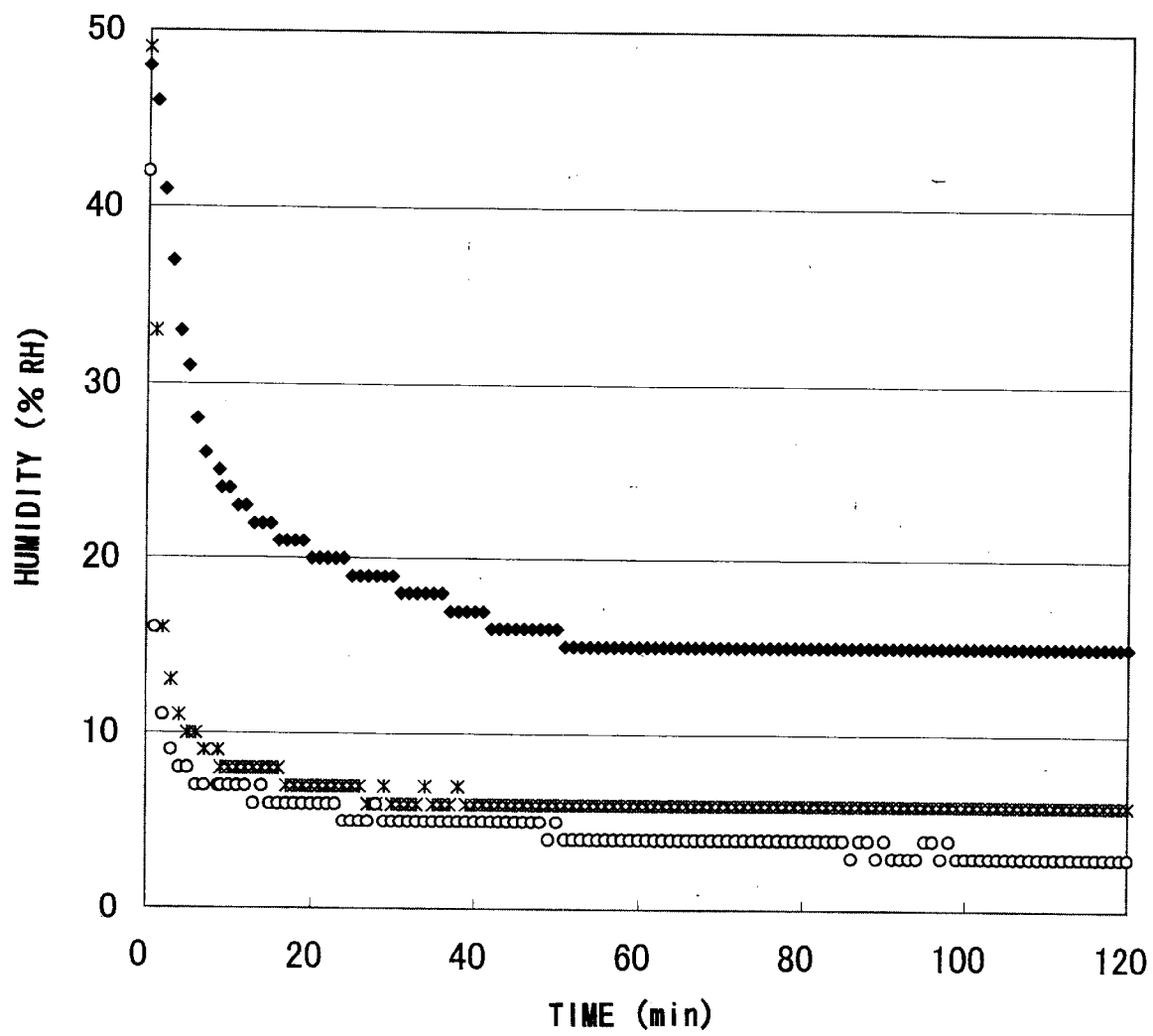
FIG. 27 is a diagram showing another dehumidifying capability according to operational condition of fan and dehumidifying unit.

It is important to provide humidity conditions to suit various processing steps in the container. When performing environmental control of all the substrate boxes operating between individual apparatuses (including shelves in apparatus front) in an actual plant, communication means may be installed inside the container for exchanging operating data on electrical drive section such as fans and dehumidifying units. The substrate box having environmental control function therein may be used for transferring substrate between process steps, between floors in a plant, or between plants. FIGS. 26, 27 show that by controlling the operating conditions of the fan and dehumidifying unit, a certain humidity environment can be created.

An example of the method of humidity control by operational patterns of the fan is shown in FIG. 26. In each case, the operating condition of the fan was compared under the common conditions that (1) two dehumidifying units are installed and both are operated; and (2) assisting moisture absorbing material is not used. The results shows that, when the fan was stopped (shown by ○ in the diagram), about 30% humidity was achieved in 20 minutes and about 20% humidity in 60 minutes, and these conditions were retained subsequently. Also, when the fan was operated intermittently (on for 30 seconds, off for 120 seconds, shown by * in the diagram), about 20% humidity was achieved in 25 minutes and about 10% in 90 minutes, and these conditions were retained subsequently. When the fan was operated continually (shown by ◆ in the diagram) about 20% humidity was achieved in 10 minutes and less than 10% in 20 minutes. From such results, it can be understood that if ion removal is priority in a process, if it is desired to perform ion removal only, it is effective to stop the dehumidifying unit for removing ions only, but if it is desired to lower humidity gradually while removing ions, the fan should be operated intermittently.

An example of the method of controlling humidity by installing two dehumidifying units comprised by polymeric solid electrolyte film by operational pattern of using two units is shown in FIG. 27. Operating conditions were varied while maintaining two common condition that (1) motor fan is operated continuously; and (2) assisting moisture absorbing material is used. The result shows that when only one dehumidifying unit was used continuously (shown by ◆ in the diagram), about 20% humidity was achieved in 20 minutes; about 15% at 40 minutes, and these conditions were retained subsequently. When the two units were operated for the first 30 minutes and then switched to a one-unit operation (shown by * in the diagram), 10% humidity was achieved in about 5 minutes, and leveled off at 8%. When two dehumidifying units were operated continuously (shown by ○ in the diagram), 10% humidity was achieved similarly in about 5 minutes, but the humidity was retained subsequently at less than 5%. Accordingly, the ultimate humidity in the container is controlled by the operating pattern according to the area of the electrolytic film. Thus, the area per unit volume of polymeric solid electrolytic film per the present substrate container should be at least 0.3 $cm^2/L$ and less than 10 $cm^2$/L, preferably more than 0.6 $cm^2/L$ and less than 5 $cm^2/L$. In any case, if rapid dehumidification is desired in a process, the fan should be operated continuously, and be combined with an assisting desiccant. The desiccant to be used in combination may include chemical filters that are treated to retain its initially most absorbing conditioned chemical filter (activated charcoal, ion exchange medium and the like). Also, by operating only one dehumidifying unit, it is possible to dehumidify relatively rapidly and the ultimate humidity reaches sufficient level with eliminating ions to sufficient level.

In practice, it is preferable to adjust the humidity so that communication means are used to customize the operational patterns of the electrical drive section such as the fan and the dehumidifying unit to suit each processing conditions. Further, by providing a humidity sensor within each container, dehumidifying unit can be made to operate automatically by detected humidity information thereby.

Figure 10A:
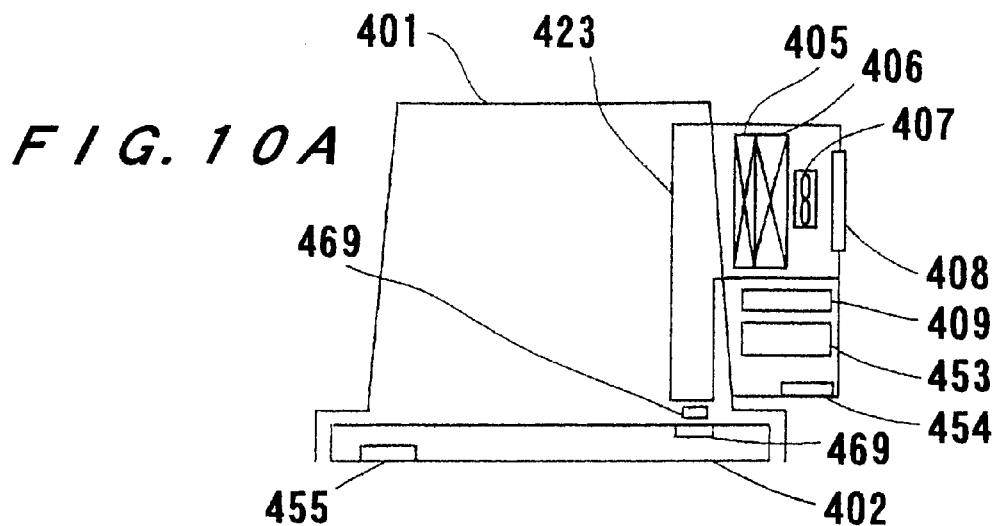
FIGS. 10A to 10C are views showing a substrate container of (A) transferring state, (B) seating state, and (C) door descending state respectively.
Figure 10B:
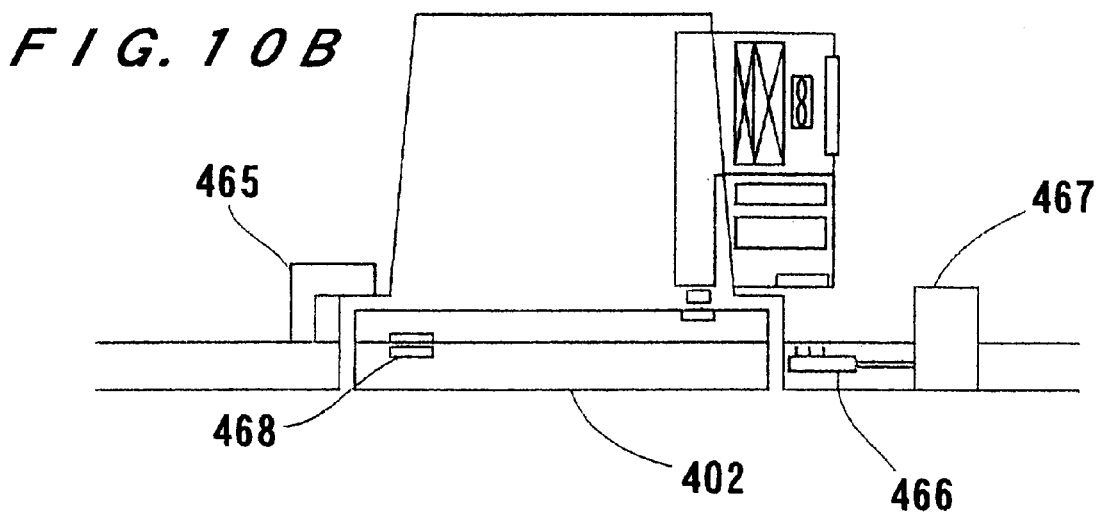
Figure 10C:
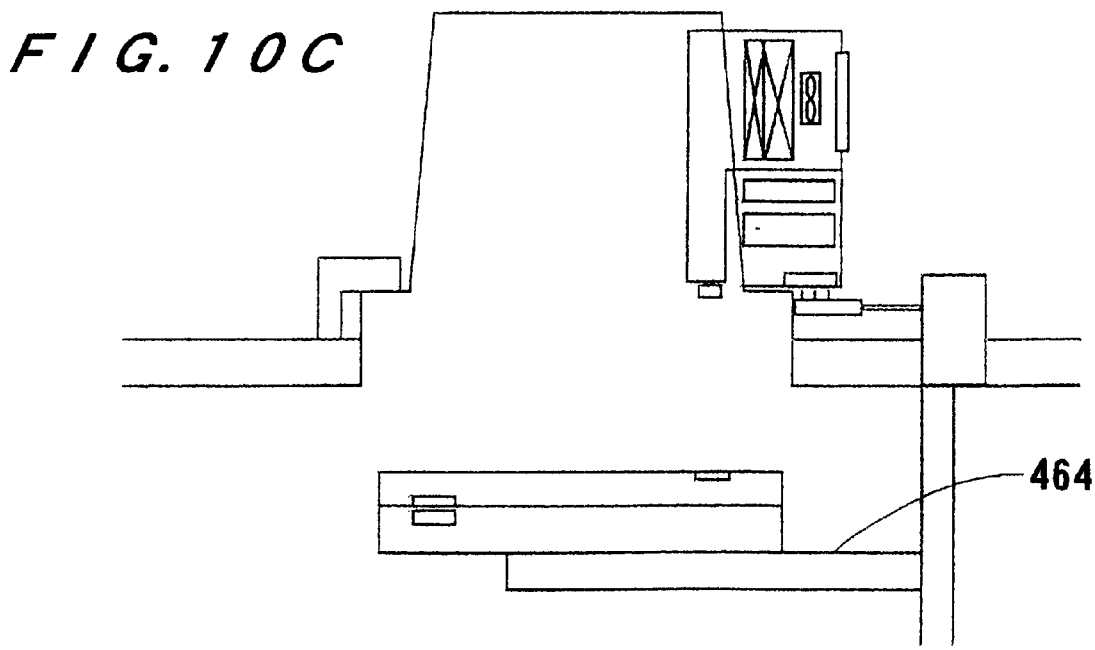

FIGS. 10A to 10C show a substrate container of (A) transferring state, (B) seating state, and (C) door descending state respectively. This substrate container having air cleaning unit comprises: a container body 401; a reactive plate or a reactive seal 455; a door 402 incorporating or provided with a door opening/closing detection sensor 469; a particle removing filter 405; a gaseous impurity trapping filter 406; a dehumidifier 408; a fan 407; a baffle plate 423; a rechargeable battery 409; an operation control plate 453; a receiving terminal 454; and a door opening/closing detection sensor. The door opening/closing detection sensor 469 is mounted so as to detect the opening/closing of the door and to control the operation of the fan motor and/or the dehumidifier. For example, when the door is open, the suction of air containing an amount of contaminants, such as particles, ions, organic matter, and moisture, from the outside of the substrate container is prevented by stopping the operation or by regulating the rotation speed of the fan motor. Instead of the opening/closing of the door, the presence or absence of the cassette and/or wafer may be detected to control the operation of the air cleaning unit.

Instead of the sensor for detecting the opening/closing of the door, a sensor for detecting the presence or absence of the cassette may be mounted. This detection sensor may be mounted on any position, for example, on the bottom, side, upper surface, or front surface of the cassette. Examples of sensors usable for detecting the cassette include mechanical, photoelectric, magnetic, and proximity sensors. A non-contact type sensor, which is not in direct contact with the cassette, is preferred.

Figure 11:
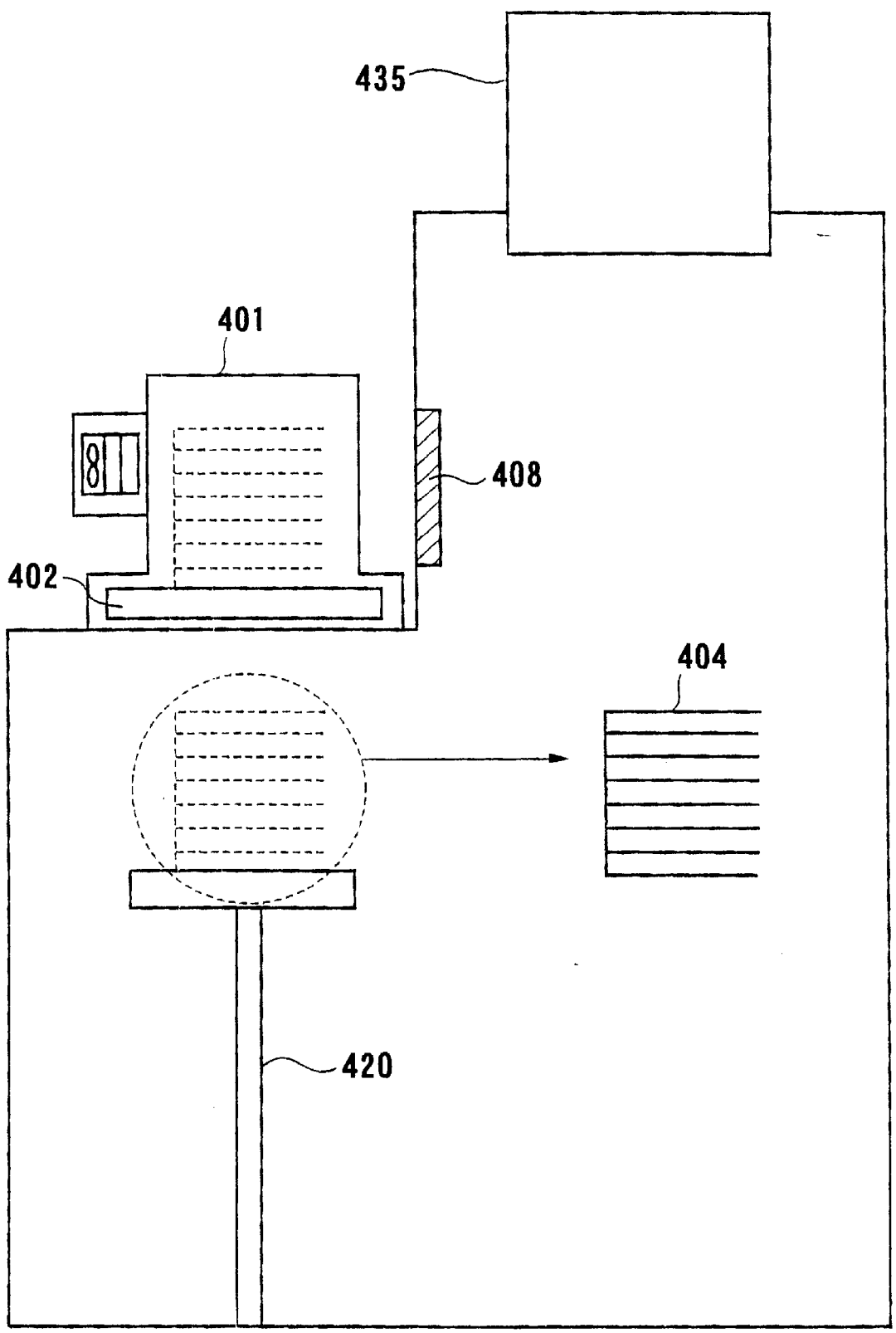
FIG. 11 is a view showing a substrate container seated on an apparatus.

The interface within the apparatus is mainly assumed to be released from the circulation system at the time of closing of the door. Therefore, the operation in that portion contributes greatly to the performance. Thus, for example, the operation of a 200 mm substrate container, which is carried into a copper plating apparatus, will be described with reference to FIG. 11. A fan filter unit 435 within the interface is composed of all of or a combination of a fan motor 407, a chemical filter 406, and an ULPA filter 405. Further, the dehumidification unit 408 according to the present invention may be installed on any place of a boundary wall between dehumidification side (within the interface) and moisture release side (clean room). A substrate carrying-in/carrying-out door 402 and a carrier 404 are separated by means of an elevating device from the substrate container body 401. A wafer W within a lot, together with the carrier 404, is transferred to the interface side. The elevating device 420 then ascends, and the substrate carrying-in/carrying-out door 402 is returned to the container body 401. The substrate container (Pod) may stand by in an empty state until the processing of one lot is completed.

Figure 12:
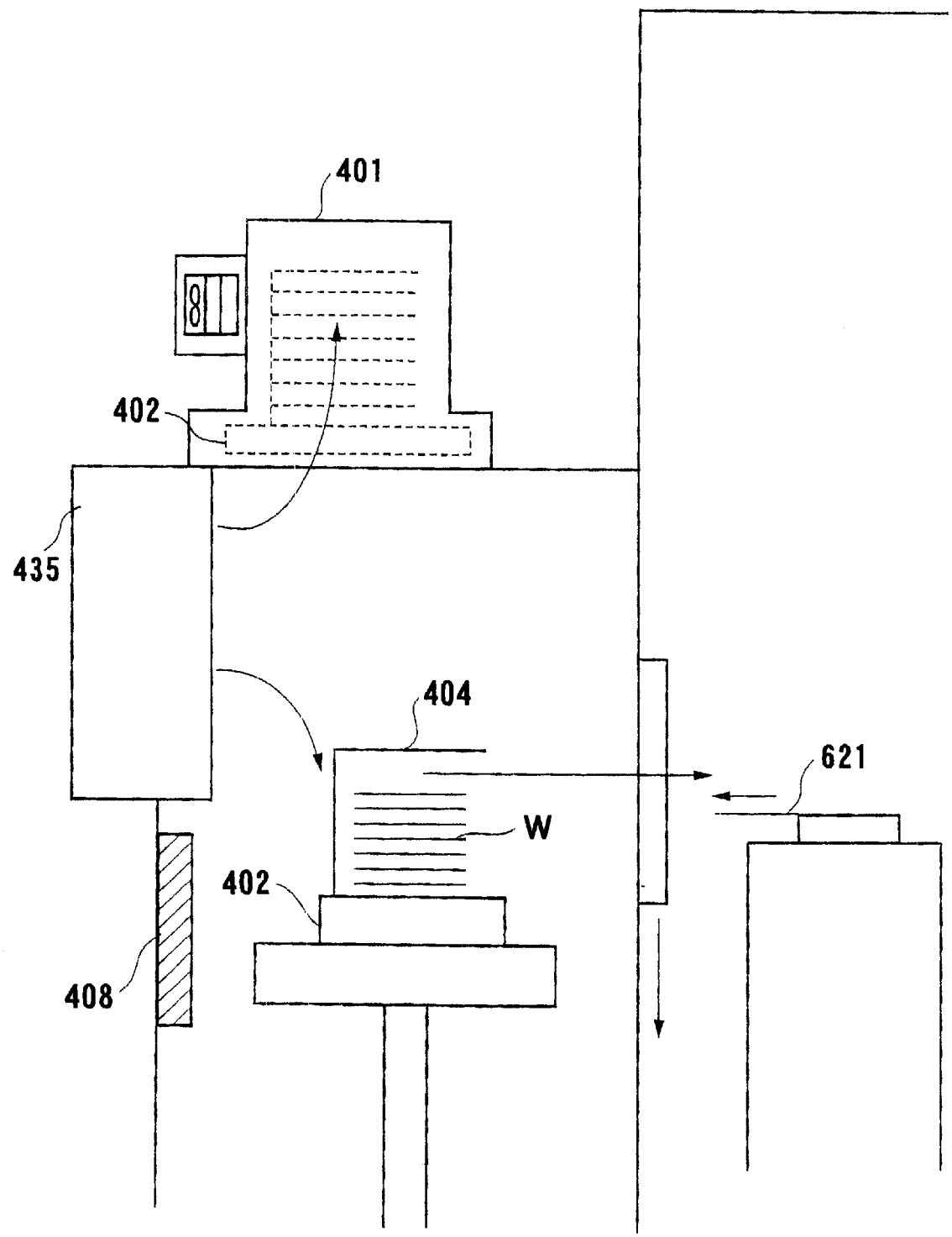
FIG. 12 is a view showing an operational state of the substrate container of FIG. 11.

Further, as shown in FIG. 12, in the case where during the processing of the lot, the substrate carrying-in/carrying-out door 402, together with the carrier and the untreated wafer, stands by and the container body 401 is allowed to stand with the body being open, an air stream is preferably fed from the fan filter unit 435 into the door 402, the carrier 404, and the wafer W, as well as into the container body 401.

Figure 13:
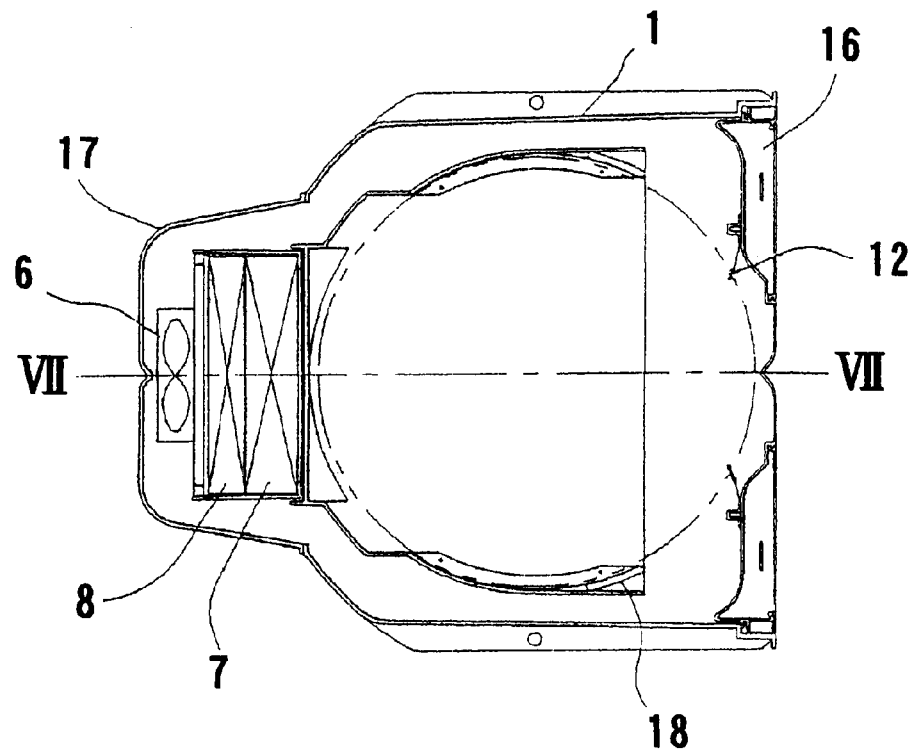
FIG. 13 is a vertical cross-sectional view of an automatized substrate container for storing wafers that are 300 mm diameter, according to another modification of the substrate container shown in FIG. 1.
Figure 14:
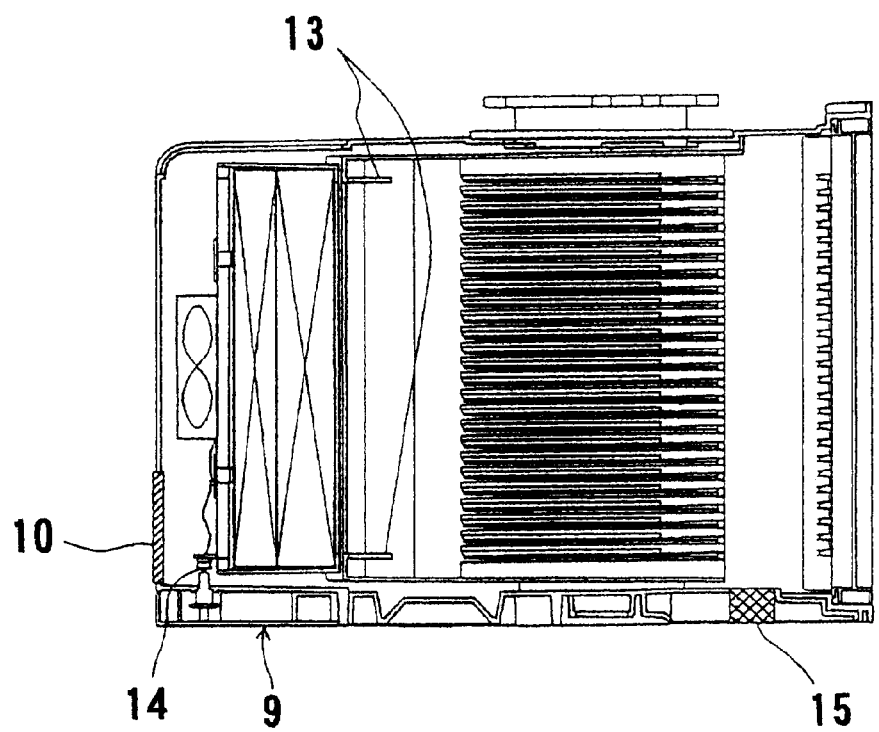
FIG. 14 is a cross-sectional view taken along line VII—VII of FIG. 13.
Figure 15:
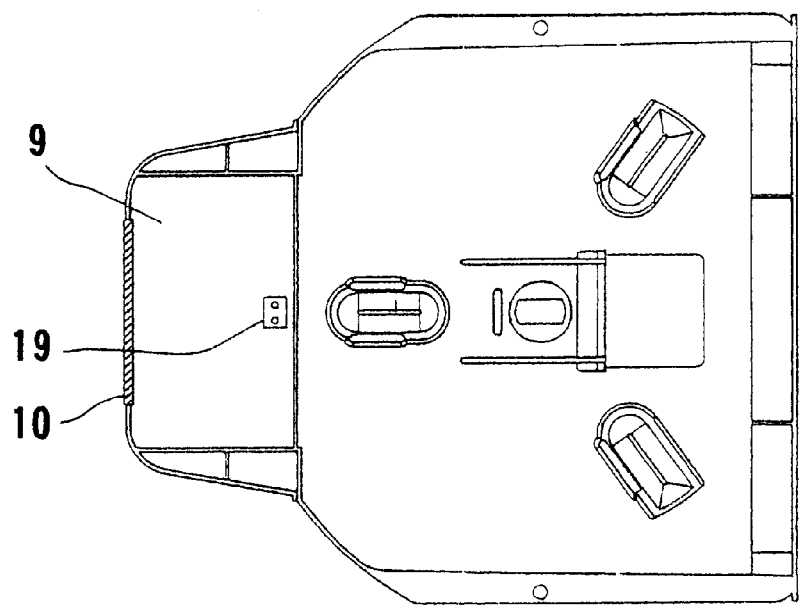
FIG. 15 is a rear elevational view of the automatized substrate container shown in FIG. 13.

FIGS. 13 through 15 show an automatized substrate container for storing wafers that are 300 mm diameter, according to another modification of the substrate container shown in FIG. 1. The automatized substrate container shown in FIGS. 13 through 15 are different from the automatized substrate container shown in FIGS. 6 and 7 in that a control circuit and a secondary battery for energizing the fan motor 6 and the dehumidifying unit 10 are contained in the power supply unit 9. The power supply unit 9 is mounted on the bottom of a cover 17 and has terminals connected to the terminals 14 of the fan motor 6. Charging terminals 19 are mounted on the bottom of the power supply unit 9. When the substrate container is placed on a device for automatically opening and closing a bottom wafer loading/unloading door 16 or a charging station, the charging terminals 19 are connected to terminals of the device or the charging station for automatically charging the secondary battery. The substrate container may be supplied with a drying gas to dry the space therein. In order to discharge the drying gas, the box housing 1 has a drying gas purge port 15 defined therein. The position, size, and number of the solid polymer electrolyte film, and the drying gas purge port 15 may be changed depending on a desired level of humidity to be reached in the substrate container and a desired dehumidifying rate.

Figure 16:
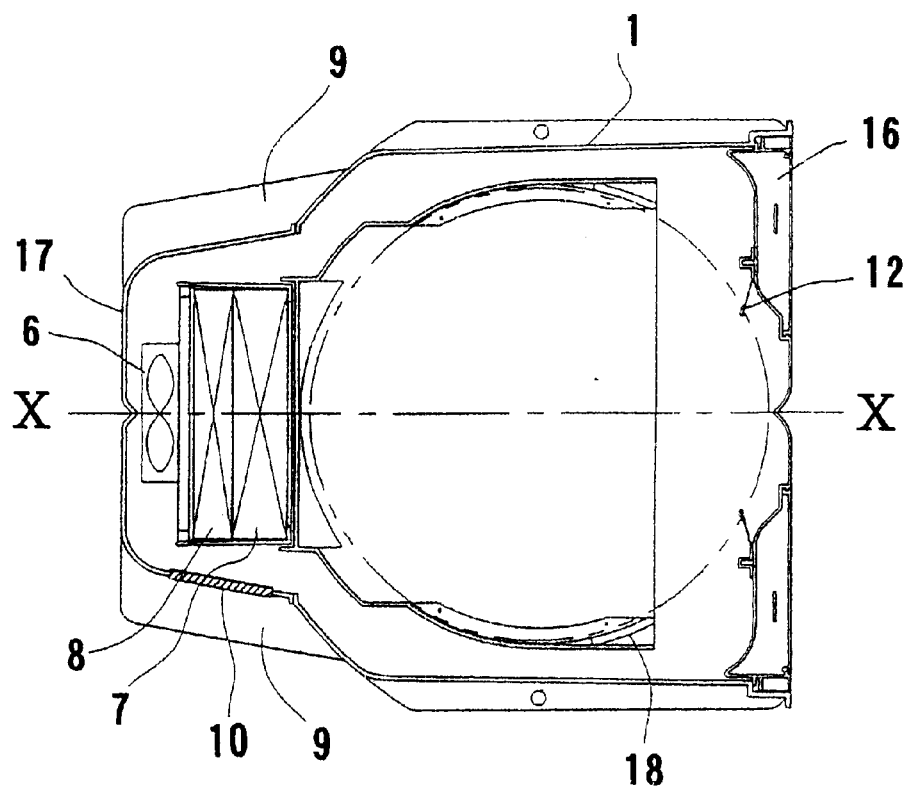
FIG. 16 is a vertical cross-sectional view of an automatized substrate container with a solid polymer electrolyte film disposed in a position different from the position of the solid polymer electrolyte film in the automatized substrate container shown in FIG. 13.
Figure 17:
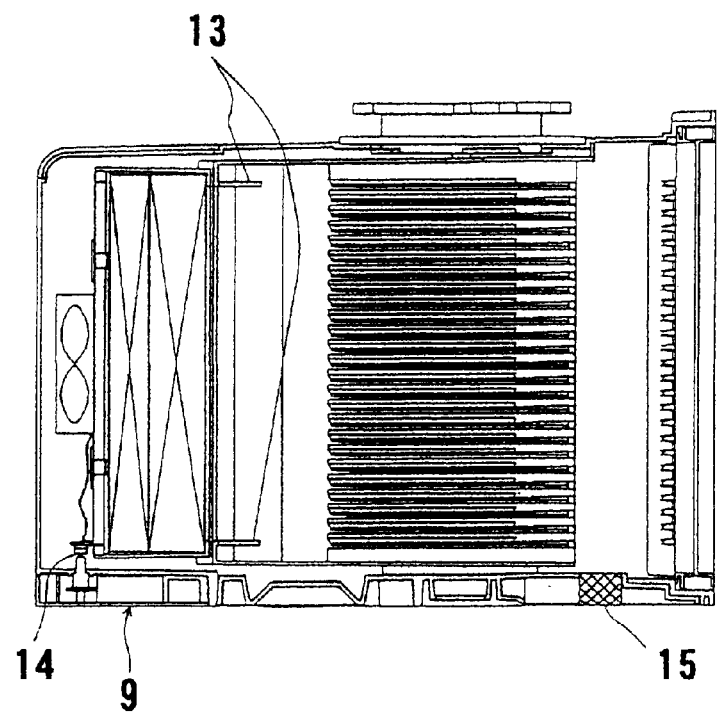
FIG. 17 is a cross-sectional view taken along line X—X of FIG. 16.
Figure 18:
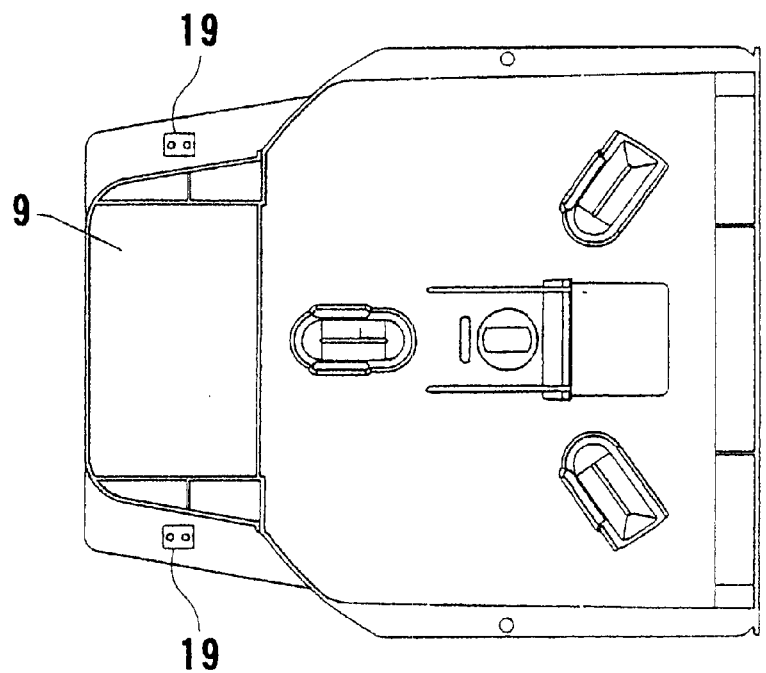
FIG. 18 is a rear elevational view of the automatized substrate container shown in FIG. 16.

FIGS. 16 through 18 show an automatized substrate container with a solid polymer electrolyte film disposed in a position different from the position of the solid polymer electrolyte film in the automatized substrate container shown in FIGS. 13 through 15. In the automatized substrate container shown in FIGS. 16 through 18, the solid polymer electrolyte film is mounted on the bottom of the box housing 1. Therefore, the solid polymer electrolyte film can be supplied with a DC voltage directly from the power supply unit 9 which is mounted in the cover 17 extending from the box housing 1, without the terminals 14.

The interface within the apparatus is mainly assumed to be released from the circulation system at the time of closing of the door. Therefore, the operation in that portion contributes greatly to the performance. Thus, the operation of the substrate-container 401, which is carried, for example, into a copper plating apparatus 434 in such a state that a plurality of substrates W are received within the container 401, will be described with reference to FIG. 19.

This copper plating apparatus 434 is provided with a device for automatically opening/closing the substrate carrying-in/carrying-out door. An amount of particulate contaminants within the copper plating apparatus 418 is reduced by a fan filter unit comprising a fan motor 407 and an ULPA filter 405. As soon as the substrate-container 401 is carried into the copper plating apparatus 434, mounted on a predetermined position, and shielded from the clean room through a gate valve or the like, the device for automatically opening/closing the substrate carrying-in/carrying-out door opens the substrate carrying-in/carrying-out door 602. Thereafter, the device for automatically opening/closing the substrate carrying-in/carrying-out door sorts the wafer-receiving slot and the number of wafers by means of a wafer mapping device 603. The substrate W is then taken out by means of a substrate handling robot 621 within the plating apparatus 434, followed by treatment. The treated substrate W is then returned to the substrate container 401. Upon the completion of the treatment of all the substrates W, the substrate carrying-in/carrying-out door 602 is closed and hermetically sealed by the device for automatically opening/closing the substrate carrying-in/carrying-out door. At that point, the fan motor 407 is put into operation through a power supply terminal 608 to clean the air within the substrate container.

Figure 19:
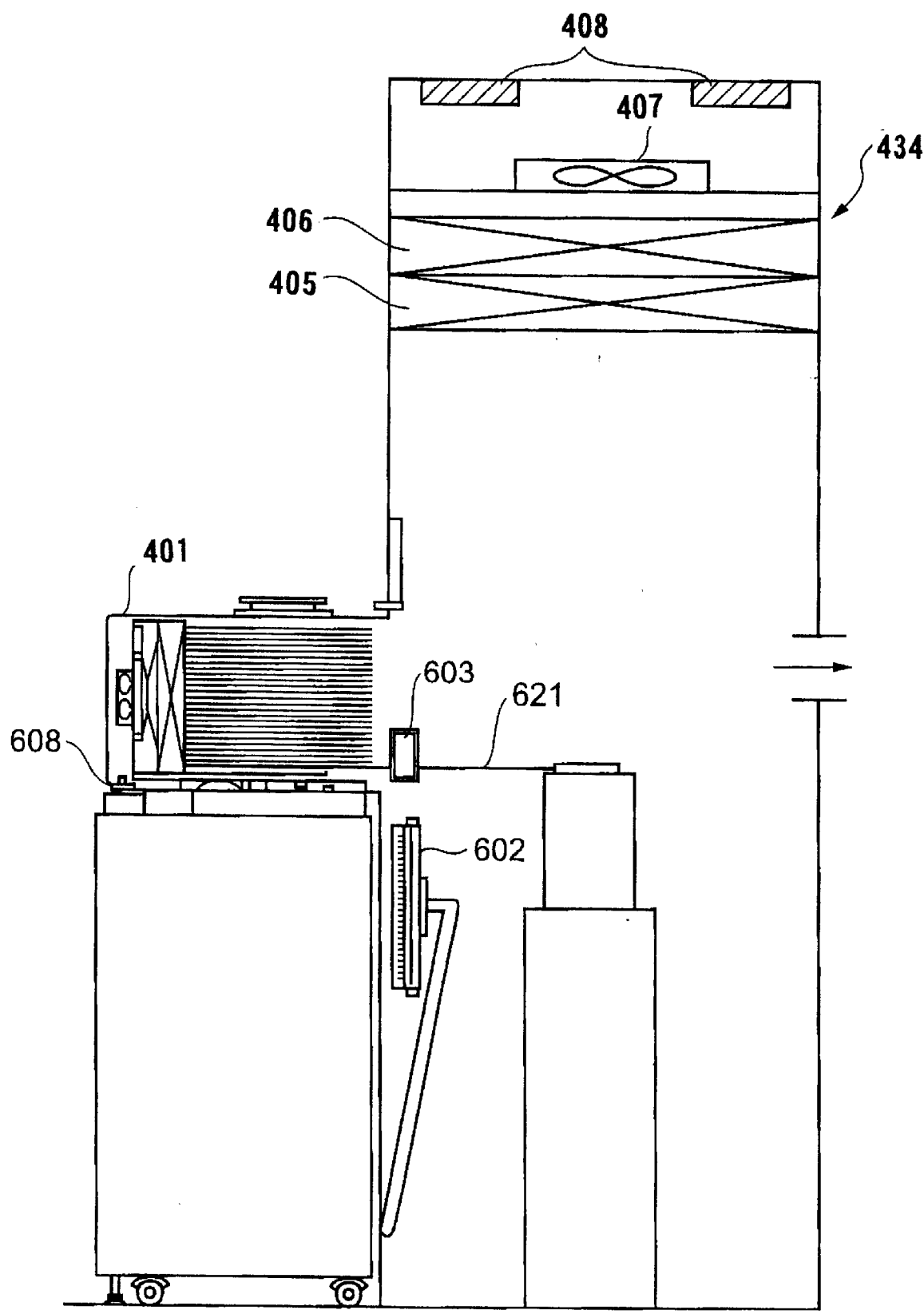
FIG. 19 is a view showing a substrate container seated on an apparatus.

As shown in FIG. 19, a construction may be adopted wherein, as soon as the wafer to be treated is taken out, the substrate carrying-in/carrying-out door 602 is closed and the stand-by wafer is stored in the closed space of substrate container (Pod). When the substrate carrying-in/carrying-out door is not opened/closed during the treatment of one lot, preferably, a fan filter unit provided with ULPA and, in addition, a chemical filter 406 and a hygroscopic agent or dehumidifier 408 are loaded on the interface so that the stand-by wafer is not contaminated, for example, with moisture or organic matter. The air flow by fan filter unit may be circulated through within the interface. Further, dehumidification using dry air or $N_2$ gas may also be used.

Figure 20:
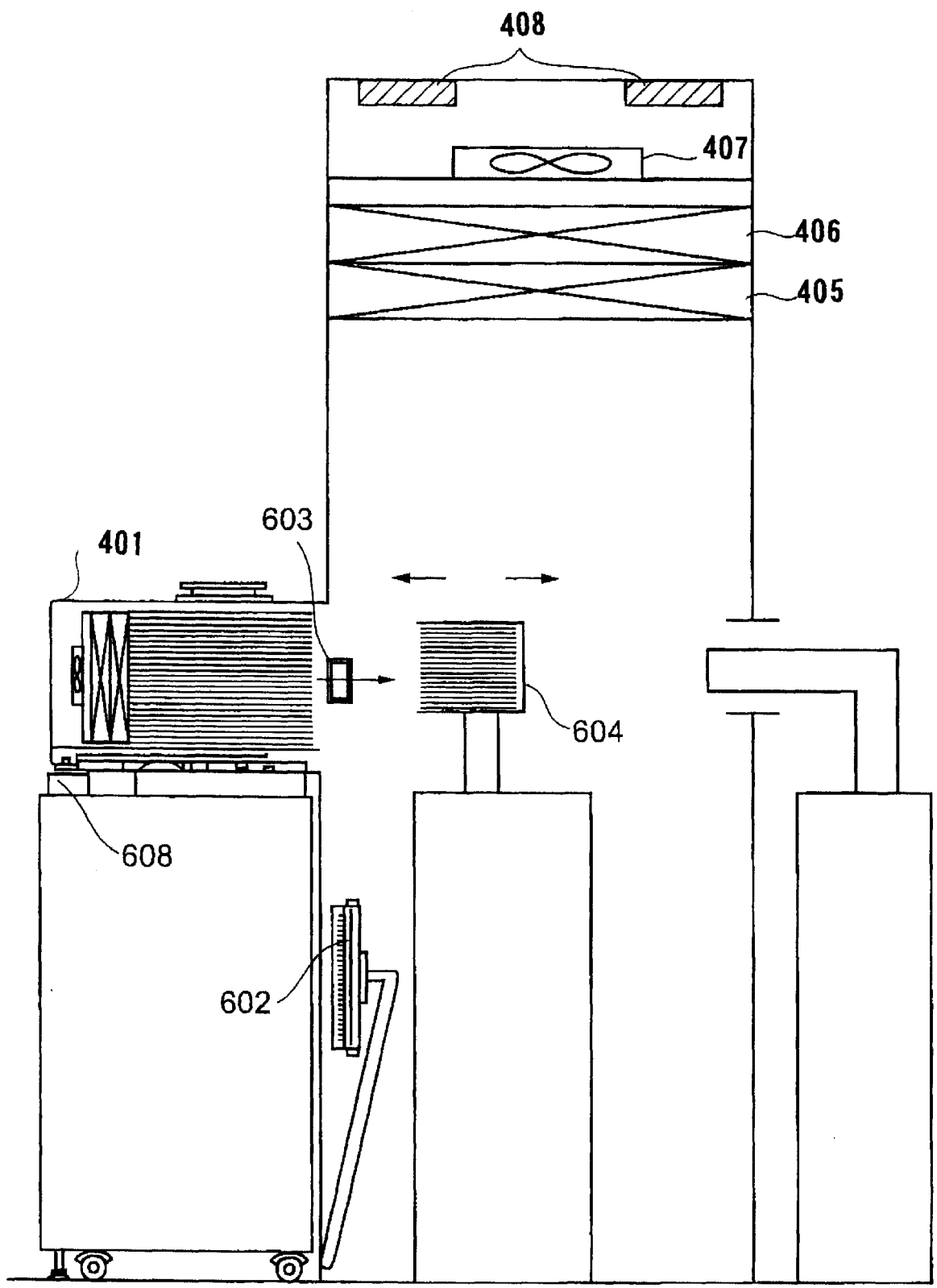
FIG. 20 is a view showing substrate transfer from the substrate container seated on an apparatus.

As shown in FIG. 20, the air cleanliness within substrate container (Pod) is higher than the air cleanliness within the interface because the space within the substrate container (Pod) is narrower. Therefore, a construction may be adopted wherein, upon setting of Pod at the inlet of the interface, wafers within Pod are transferred by one lot at a time to a cassette 604, in the interface body, on which the wafers are temporarily placed. Until the treatment of the lot is completed, the empty Pod stands by in such a state that the door is closed and, in this state, a current is supplied through a power supply terminal to perform dummy operation of Pod to keep the air cleanliness within the Pod. In this case, as with the system shown in FIG. 19, a fan filter unit provided with ULPA filter and, in addition, a chemical filter and a hygroscopic agent or dehumidifier is preferably mounted on the interface. The fan filter unit may circulate air flow through within the interface. Further, dehumidification using dry air or $N_2$ gas may also be used. The substrate carrying-in/carrying-out door 602 is then closed, followed by transferring the substrate carrier to an apparatus for next processing or a storehouse, for example, by OHT or AGV. Here, transfer means any meaning of transfer, for example, between process steps, between floors in a plant, or between plants. The substrate container can be used not only for transfer but also for storage.

Figure 22:
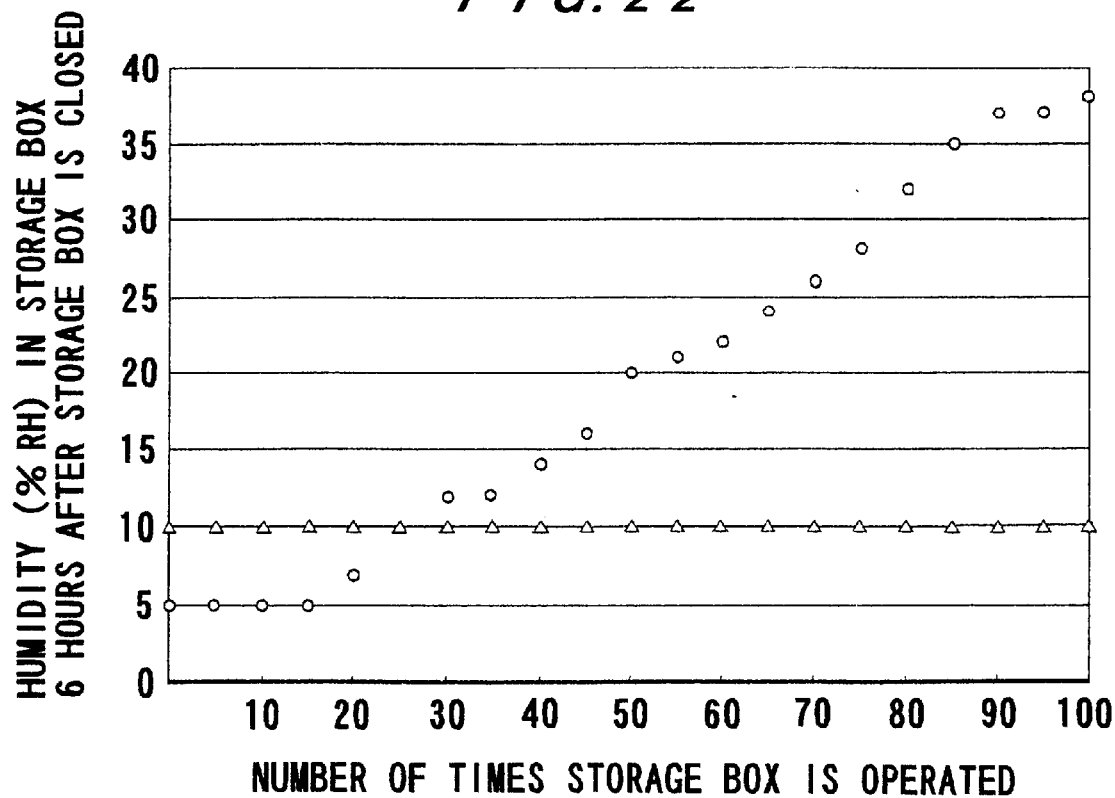
FIG. 22 is a diagram showing, for comparison, a dehumidifying capability of a dehumidifying unit with a solid polymer electrolyte film according to the present invention and a dehumidifying capability of a conventional desiccant.

FIG. 22 shows the dehumidifying capability of the dehumidifying unit 10 with the solid polymer electrolyte film at the time it is used in repeated cycles. In a clean room held at a temperature of 22° C. and a relative humidity of 40%, the carrier 4 holding 20 cleaned semiconductor wafers was placed into the substrate container, and the humidity reached 6 hours after the substrate container was closed was measured. Measured data from the substrate container with the dehumidifying unit 10 are indicated by Δ in FIG. 22. In FIG. 22, the horizontal axis represents the number of times that the substrate container was operated, and the vertical axis the reached humidity. For comparison, a desiccant was placed in a substrate container, and the humidity in the substrate container was measured. Measured data from the substrate container with the desiccant are indicated by ○ in FIG. 22. The substrate container with the desiccant kept its initial dehumidifying capability, i.e., the ability to dehumidifying the space therein by 5% from the relative humidity of 40%, until the substrate container was used in 15 repeated cycles. Thereafter, the reached humidity gradually increased, and did not fall below 20% after the substrate container was used in 50 repeated cycles. The substrate container with the dehumidifying unit continuously kept its initial dehumidifying capability, i.e., the ability to dehumidifying the space therein by 10% from the relative humidity of 40%.

Figure 23:
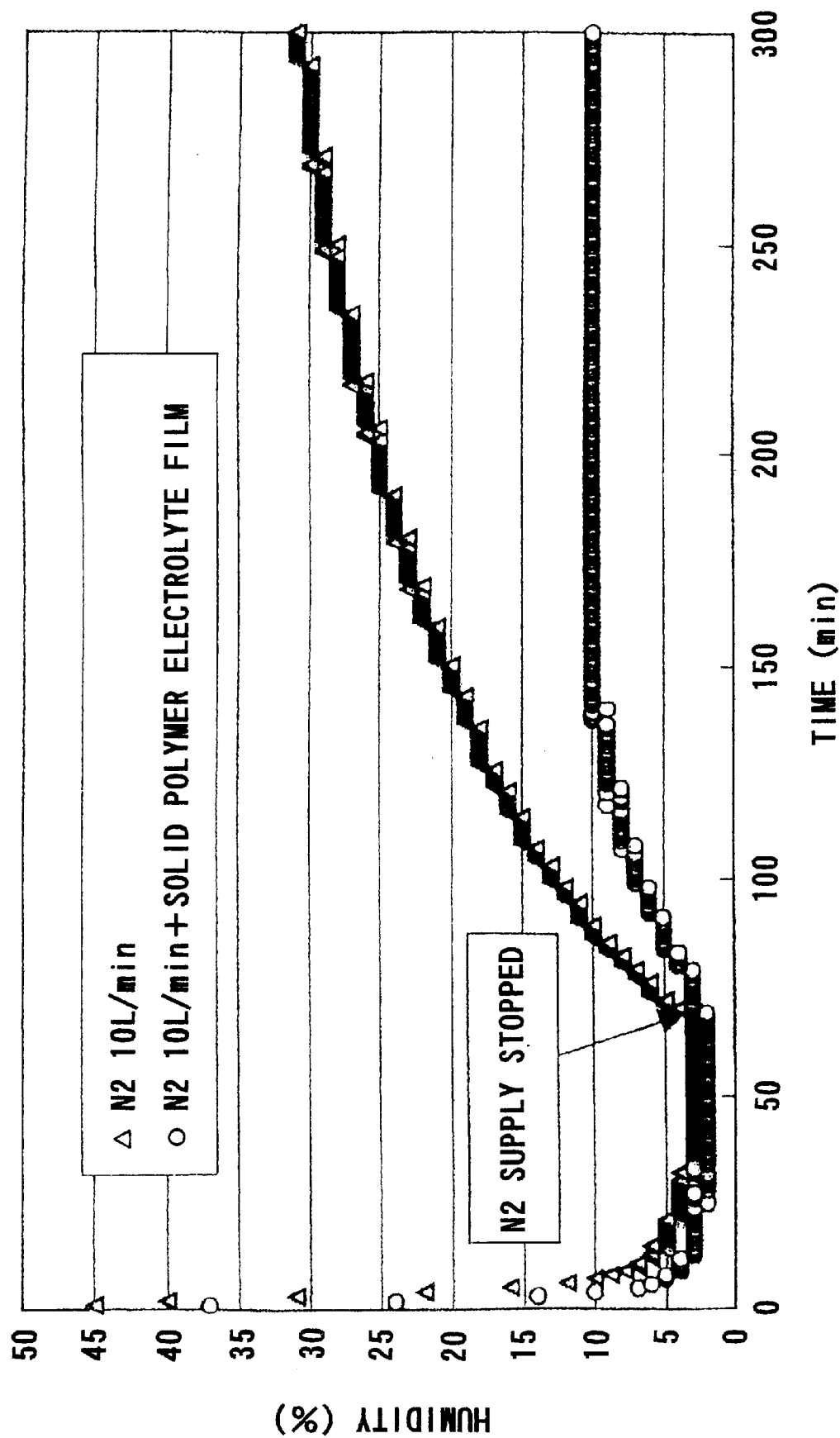
FIG. 23 is a diagram showing a rate at which the humidity in a container drops when the container is supplied with drying air and the container is equipped with a dehumidifying unit with a solid polymer electrolyte film, and in also showing a rate at which the humidity in the container rises after the supply of drying air is stopped.

The dehumidifying capability of the substrate container which is supplied with a drying gas and equipped with the solid polymer electrolyte film will be described below with reference to FIG. 23.

The substrate container with the solid polymer electrolyte film was placed in a clean room at a temperature of 22° C. and a humidity of 45% RH. After dry air was supplied to the substrate container at a rate of 10 L/min. for one hour, the supply of dry air was stopped. The solid polymer electrolyte film started to be energized when dry air started to be supplied, and was continuously energized until after data were measured. A sealed container which was made of the same material and had substantially the same volume as the substrate container with the solid polymer electrolyte film was placed in the same clean room, and after dry air was supplied to the substrate container at a rate of 10 L/min. for one hour, the supply of dry air was stopped. The humidity in the substrate container with the solid polymer electrolyte film was maintained at 10% RH after 5 hours (as shown by ◯). The humidity in the sealed container increased to 30% RH in 4 hours after the supply of dry air was stopped (as shown by Δ).

When the air within the highly hermetically sealed container is replaced by dry gas, that is, dry air or moisture-free inert gas, immediately after the replacement, the humidity is lowered to the lower limit of humidity, approximately 0%. However, when the feed of the dry gas is stopped and, in this state, the container is allowed to stand, moisture held in the polymeric material in the inner wall surface within the container is diffused into the container due to humidity gradient. Therefore, the humidity within the container with the air having been replaced by the dry gas increases with the elapse of time.

Figure 24:
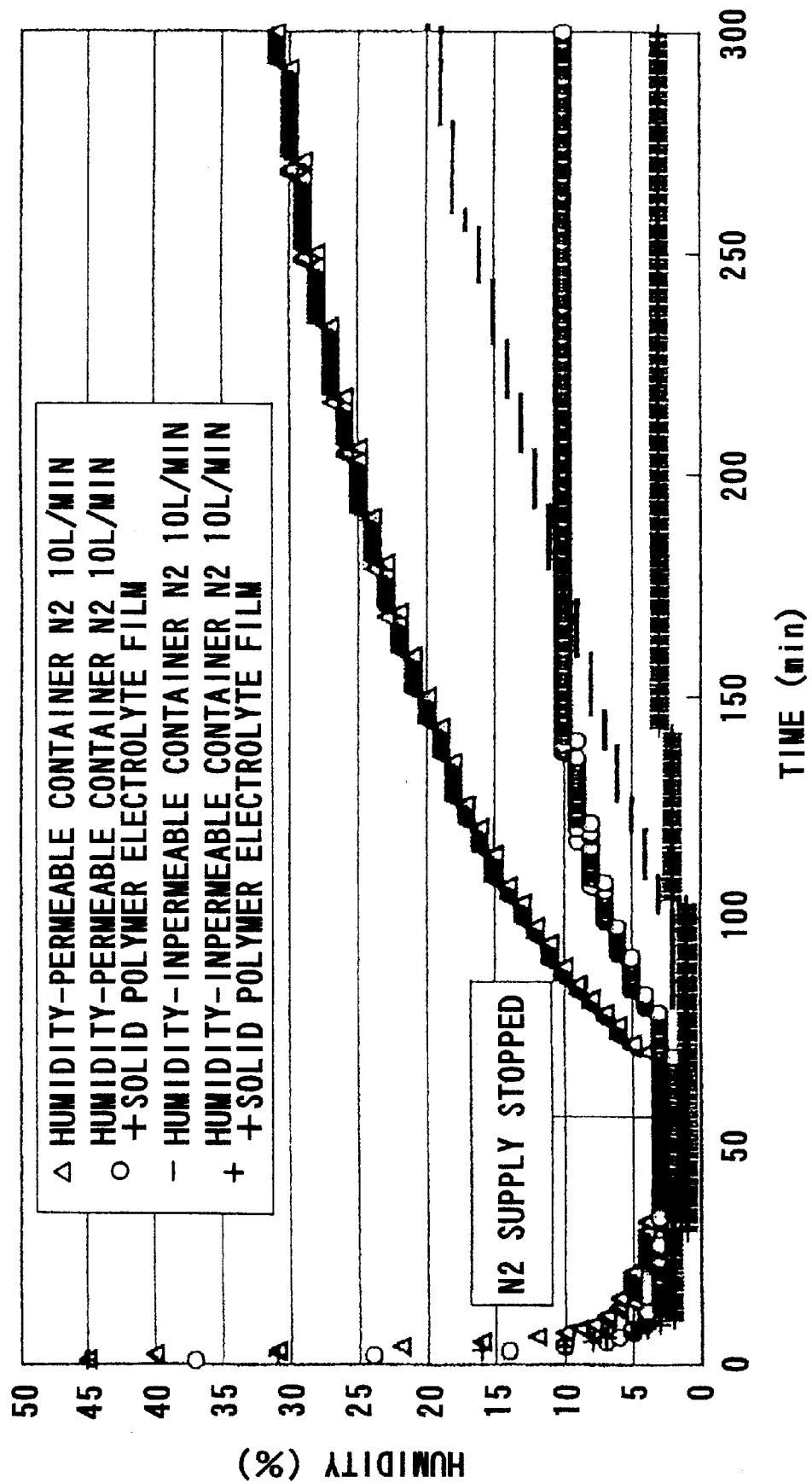
FIG. 24 is a diagram showing a rate at which the humidity in a container drops and a rate at which the humidity in the container rises after the supply of drying air is stopped, with respect to a container material coated with a humidity-impermeable material and a container material not coated with a humidity-impermeable material.

The dehumidifying capability achieved when the container material was coated with a humidity-impermeable material will be described below with reference to FIG. 24. The substrate container with the solid polymer electrolyte film and a substrate container which had the same shape as the substrate container with the solid polymer electrolyte film and whose box housing material was coated with a humidity-impermeable material were placed in a clean room at a temperature of 22° C. and a humidity of 45% RH. These substrate containeres were operated in the same manner as described above with reference to FIG. 23. The substrate container coated with the humidity-impermeable material was better than the substrate container not coated with the humidity-impermeable material with respect to the dehumidifying rate and the reached humidity. The humidity in the substrate container coated with the humidity-impermeable material dropped to 10% RH in about 10 minutes. The humidity in the substrate container coated with the humidity-impermeable material was maintained at a low level after the supply of dry air was stopped.

FIGS. 25A and 25B show a substrate storage device according to a second embodiment of the present invention.

The substrate storage device according to the second embodiment serves to hold or transport a maximum of five carriers (holding cases) 4 each holding a plurality of semiconductor wafers or substrates vertically. The substrate storage device comprises a slender hermetically sealed casing 20 made of a material which does not produce particles, e.g., polycarbonate. The space in the casing 20 is divided by partitions 5 into a horizontal array of a fan chamber 25 and five storage chambers 26. Doors 24 are mounted by respective hinges on front sides of the respective storage chambers 26, and can individually be opened and closed. The casing 20 has an air supply passage 27 and an air discharge passage 28 defined therein respectively below and above the fan chamber 25 and the storage chamber 26. The fan chamber 25 and the storage chamber 26 are held in fluid communication with the air supply passage 27 and the air outlet passage 28.

The fan chamber 25 houses therein a fan motor 6 for delivering air downwardly, a chemical filter 21 detachably positioned upstream of the fan motor 6 for preventing air from flowing backward, a chemical filter 22 detachably positioned downstream of the fan motor 6 for removing impurity gases, and a particle removing filter 23 detachably positioned downstream of the fan motor 6 and the chemical filter 22 for removing particles. The casing 20 houses a power supply unit 9 disposed outwardly and laterally of the fan chamber 25. The power supply unit 9 includes a control device for controlling the times to energize and de-energize the fan motor 6 and its rotational speed according to a control program stored therein.

The chemical filter 22 is made of a woven fabric of ion exchange fibers and activated carbon fibers. Alternatively, the chemical filter 22 may be made of either ion exchange fibers, or activated carbon fibers, or both, or may comprise a particulate activated carbon filter or an activated carbon honeycomb filter. The particle removing filter 23 comprises a HEPA filter and a ULPA filter. The HEPA filter is an air filter capable of trapping 99.97% or more of particles having a particle size of 0.3 $\mu$m at a rated air flow rate. The ULPA filter is an air filter capable of trapping 99.9995% or more of particles having a particle size of 0.1 $\mu$m.

The substrate storage device according to the second embodiment has a dehumidifying unit 10 with a solid polymer electrolyte film, which is positioned in the air supply passage 27 near the fan chamber 25. Alternately, the dehumidifying unit 10 may be positioned in the air discharge passage 28. The solid polymer electrolyte film has an area of several cm×several cm, and a thickness of about several hundreds $\mu$m, and has a sufficient dehumidifying capability. The solid polymer electrolyte film has an anode and a cathode between which a DC voltage is applied from the power supply unit 9. The power supply unit 9 should preferably have a voltage varying mechanism for varying the DC voltage applied across the solid polymer electrolyte film. The DC voltage may be applied according to a predetermined pattern such that after the substrate storage device is opened, the DC voltage is increased to provide an increased dehumidifying ability, and thereafter the DC voltage is lowered to reach a desired level of humidity in the substrate storage device.

In the above embodiments, the substrate containeres and the substrate storage device have been described in detail. However, the principles of the present invention are also applicable to a clean box, a substrate carrier container, a substrate holding rack, or the like for storing or transporting various substrates. Further, the substrate containeres and the substrate storage device according to the present invention can be used not only for above described embodiments of transportaion between systems, but also useful in the modified embodiments such as a transportation between process steps, within a process step, between floors and between plants As described above, the substrate containeres and the substrate storage device according to the present invention produce a circulating air flow therein, and have a dehumidifying unit with a solid polymer electrolyte film which is capable of providing a highly clean environment with a function to set a level of humidity to be reached to a desired value and a semipermanent dehumidifying function. As a result, various substrates can be held and transported in a desirable environment. Furthermore, the substrate container and the substrate storing apparatus having a plurality of storage sections are used not only for transporting between the systems as explained in the embodiments but they can also be used for transporting between the processes, within a process, between different floors or plants.

Although certain preferred embodiments of the present invention have been shown and described in detail, it should be understood that various changes and modifications may be made therein without departing from the scope of the appended claims.

What is claimed is:

1. A substrate container comprising:
    a container housing having an opening for storing a substrate therethrough and a cover sealingly covering said opening;
    a fan motor mounted in said container housing for producing a circulating path of air in contact with the substrate in said container housing, wherein a substrate holder holds said substrate substantially parallel to said circulating path;
    a particle removing filter and a gaseous impurity trapping filter which are disposed in a portion of said circulating path which extends toward said substrate; and
    dehumidifying means for dehumidifying a space in said container housing, said dehumidifying means comprising a solid polymer electrolyte film disposed in said circulating path and voltage applying means for applying a voltage to said solid polymer electrolyte film to decompose water in air flowing in said circulating path thereby to dehumidify a space in said container housing.

2. A substrate container according to claim 1, further comprising:
    a plurality of storage chambers for individually loading and unloading substrates or containers which hold substrates;
    said circulating path including air supply passage and an air discharge passage which are held in communication with said storage chambers; and
    common air circulating means for circulating clean air through said storage chambers through said air supply passage and said air discharge passage.

3. A substrate container according to claim 1, wherein said dehumidifying means further comprises:
    an anode mounted on one surface of said solid polymer electrolyte film, with a catalyst attached to said anode for promoting a dehumidifying action; and
    a cathode mounted on the other surface of said solid polymer electrolyte film;
    said voltage applying means comprising means for applying the voltage between said anode and said cathode across said solid polymer electrolyte film to control the humidity in the space in said container housing.

4. A substrate container according to claim 1, wherein said dehumidifying means further comprises:
    means for dehumidifying the space in said container housing with said solid polymer electrolyte film while or after the said container housing is filled with a drying gas.

5. A substrate container according to claim 1, wherein said container housing has an outer wall made of a humidity-impermeable material or a humidity-permeable material coated with a humidity-impermeable material.

6. A method of dehumidifying a substrate container comprising:
    producing a circulating air flow in a container housing, said container housing having an opening for storing a substrate therethrough and a cover sealingly covering said opening; and
    applying a voltage to a solid polymer electrolyte film placed in contact with said circulating air flow to decompose water in said circulating air flow thereby to dehumidify a space in said container housing;
    wherein a substrate holder holds said substrate substantially parallel to said circulating path.

7. A method according to claim 6, wherein said space in said container housing is dehumidified while or after the container housing is filled with a drying gas.

8. A substrate container according to claim 6, wherein a particle removing filter is disposed in a portion of said circulating path which extends toward said substrate.

9. A substrate container according to claim 6, wherein a gaseous impurity trapping filter is disposed in a portion of said circulating path which extends toward said substrate.

10. A substrate container according to claim 6, wherein said dehumidifying unit is disposed in said circulating path at upstream of a particle removing filter or a gaseous impurity trapping filter.

11. A substrate container comprising:
    a container housing having an opening for storing a substrate therethrough and a cover sealingly covering said opening;
    a fan motor mounted in said container housing for producing a circulating path of air in contact with the substrate in said container housing, wherein a substrate holder holds said substrate substantially parallel to said circulating path; and
    a dehumidifying unit for dehumidifying a space in said container housing, said dehumidifying means comprising a solid polymer electrolyte film disposed in said circulating path and a power supplying unit for applying a voltage to said solid polymer electrolyte film to decompose water in air flowing in said circulating path thereby to dehumidify a space in said container housing.

12. A substrate container according to claim 11, wherein a particle removing filter is disposed in a portion of said circulating path which extends toward said substrate.

13. A substrate container according to claim 11, wherein a gaseous impurity trapping filter is disposed in a portion of said circulating path which extends toward said substrate.

14. A substrate container according to claim 11, wherein said dehumidifying unit is disposed in said circulating path at upstream of a particle removing filter or a gaseous impurity trapping filter.

* * * * *